(12) United States Patent
Rossman et al.

(10) Patent No.: US 6,696,362 B2
(45) Date of Patent: Feb. 24, 2004

(54) METHOD FOR USING AN IN SITU PARTICLE SENSOR FOR MONITORING PARTICLE PERFORMANCE IN PLASMA DEPOSITION PROCESSES

(75) Inventors: Kent Rossman, Orlando, FL (US); Leonard Jay Olmer, Orlando, FL (US); Phillip Nguyen, Kissimmee, FL (US)

(73) Assignee: Applied Materials Inc., Santa Clara, CA (US)

( * ) Notice: Subject to any disclaimer, the term of this patent is extended or adjusted under 35 U.S.C. 154(b) by 8 days.

(21) Appl. No.: 10/122,058

(22) Filed: Apr. 12, 2002

(65) Prior Publication Data

US 2002/0163637 A1 Nov. 7, 2002

Related U.S. Application Data

(63) Continuation-in-part of application No. 09/780,800, filed on Feb. 8, 2001, now Pat. No. 6,589,868.

(51) Int. Cl.[7] .................. H01L 21/31; H01L 21/469
(52) U.S. Cl. .................. 438/680; 438/768; 438/56; 250/262; 250/263; 250/264; 250/266; 250/371; 250/306; 73/514.25
(58) Field of Search .................. 438/768, 680, 438/56, 14; 250/262–266, 371, 306; 73/514.25

(56) References Cited

U.S. PATENT DOCUMENTS

| | | | | | |
|---|---|---|---|---|---|
| 4,893,928 | A | * | 1/1990 | Knollenberg | ............... 356/336 |
| 5,083,865 | A | | 1/1992 | Kinney et al. | |
| 5,271,264 | A | * | 12/1993 | Chanayem | ............... 73/29.01 |
| 5,274,434 | A | | 12/1993 | Morioka et al. | |
| 5,347,138 | A | | 9/1994 | Aqui et al. | |
| 5,387,777 | A | * | 2/1995 | Bennett et al. | ......... 219/121.43 |
| 5,481,357 | A | | 1/1996 | Ahsan et al. | |
| 5,517,027 | A | * | 5/1996 | Nakagawa et al. | ......... 250/306 |
| 5,565,985 | A | | 10/1996 | Fishkin et al. | |
| 5,608,155 | A | * | 3/1997 | Ye et al. | ................ 73/28.01 |
| 5,637,881 | A | * | 6/1997 | Burghard et al. | ............ 250/573 |
| 5,798,829 | A | * | 8/1998 | Vaez-Iravani | ............... 356/237 |
| 5,909,276 | A | * | 6/1999 | Kinney et al. | ............... 356/237 |
| 5,943,130 | A | * | 8/1999 | Bonin et al. | ................ 356/336 |
| 5,943,551 | A | * | 8/1999 | Schemmel et al. | ............ 438/14 |
| 5,963,315 | A | * | 10/1999 | Hiatt et al. | ............... 356/237.3 |
| 6,011,622 | A | | 1/2000 | Fishkin et al. | |
| 6,125,789 | A | * | 10/2000 | Gupta et al. | ................ 118/723 |
| 6,180,415 | B1 | * | 1/2001 | Schultz et al. | .............. 436/518 |
| 6,479,098 | B1 | * | 11/2002 | Yoo et al. | ................... 427/237 |
| 2001/0002315 | A1 | * | 5/2001 | Schultz et al. | .............. 436/172 |
| 2002/0146512 | A1 | * | 10/2002 | Rossman | ............... 427/255.28 |
| 2002/0163637 | A1 | * | 11/2002 | Rossman et al. | ......... 356/237.4 |
| 2003/0051665 | A1 | * | 3/2003 | Zhao et al. | .................. 118/723 |

OTHER PUBLICATIONS

W. Whitlock et al. "FAST particle detection for in–situ reactor analysis" 1993 IEEE/SEMI advanced semiconductor manufacturing conference 1993 p. 201–203.*

* cited by examiner

*Primary Examiner*—Matthew Smith
*Assistant Examiner*—Granvill D Lee, Jr.
(74) *Attorney, Agent, or Firm*—Townsend & Townsend & Crew

(57) ABSTRACT

Methods are provided for identifying root causes of particle issues and for developing particle-robust process recipes in plasma deposition processes. The presence of in situ particles within the substrate processing system is detected over a period of time that spans multiple distinct processing steps in the recipe. The time dependence of in situ particle levels is determined from these results. Then, the processing steps are correlated with the time dependence to identify relative particle levels with the processing steps. This information provides a direct indication of which steps result in the production of particle contaminants so that those steps may be targeted for modification in the development of particle recipes.

13 Claims, 21 Drawing Sheets

METHOD FOR USING AN IN SITU PARTICLE SENSOR FOR MONITORING PARTICLE PERFORMANCE IN PLASMA DEPOSITION PROCESSES

CROSS-REFERENCE TO RELATED APPLICATION

This application is a continuation-in-part application of U.S. patent application Ser. No. 09/780,800 by Kent Rossman, entitled "SI SEASONING TO REDUCE PARTICLES, EXTEND CLEAN FREQUENCY, BLOCK MOBILE IONS AND INCREASE CHAMBER THROUGHPUT," filed Feb. 8, 2001 ("the '800 application"), the entire disclosure of which is herein incorporated by reference in its entirety for all purposes and which is now U.S. Pat. 6,589,868.

BACKGROUND OF THE INVENTION

One of the primary steps in the fabrication of modern semiconductor devices is the formation of a thin layer on a semiconductor substrate by chemical reaction of gases. Such a deposition process is referred to generally as chemical-vapor deposition ("CVD"). Conventional thermal CVD processes supply reactive gases to the substrate surface where heat-induced chemical reactions take place to produce a desired layer. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive. "High-density" is understood in this context to mean having an ion density that is equal to or exceeds $10^{11}$ ions/cm$^3$.

Because these processes are used in the precise manufacture of small-scale devices, it is especially desirable to limit the incidence of damage to the substrates during processing. A common source of damage can be attributed to the presence of particles on the substrates. With the development of integrated circuits having feature sizes as small as 0.18 µm and the industry continuing to develop circuits with even smaller features, even particles smaller than about 0.1 µm can have a significant detrimental effect on overall device yield. Some estimates suggest that particle contamination may be responsible for more than 80% of all product yield loss.

To reduce the level of particle contamination and thereby increase device yield, methods have been developed to remove particulate contaminants as part of wafer preparation. For example, a common technique for removing such contamination uses wet chemical cleans. More recently, mechanical techniques have been developed, such as the CryoKinetic aerosol method, which has been incorporated into some integrated-circuit manufacturing lines to enhance yield and reduce defects. With this method, an array of cryogenic aerosol jets having frozen clusters of a mixture of argon and nitrogen is directed at the wafer. The contaminant particles are dislodged from the wafer when impacted by the clusters.

Such methods fail, however, to address the underlying problem of how the wafers become contaminated in the first place. This may be due to aspects of the wafer processing that vary according to different specific procedures. In order to identify the root causes of particle contamination, one procedure has been to examine the contaminated wafers to identify the composition of the particles and thereby identify the processing step at which they were incorporated into the layers. Such procedures have taken precise cross sections through the particles and then used techniques such as scanning electron microscopy, energy dispersive spectroscopy, or focused ion-beam spectroscopy to identify the source of the contaminant.

These techniques are time-consuming and generally inefficient. There remains a need for a method that provides real-time monitoring of particle performance during the manufacturing processes, which can be used to identify the root causes of particle issues efficiently and thereby develop particle-robust process recipes.

SUMMARY OF THE INVENTION

Embodiments of the invention therefore provide methods for identifying the root causes of particle issues and for developing particle-robust process recipes. This is achieved with methods that permit identification of a source of particle contamination in a particular recipe used for processing a substrate with a substrate processing system. In one set of embodiments, the presence of in situ particles within the substrate processing system is detected over a period of time that spans multiple distinct processing steps in the recipe. The time dependence of in situ particle levels is determined from these results. Then, the processing steps are correlated with the time dependence to identify relative particle levels with the processing steps. This information thus provides a direct indication of which steps result in the production of particle contaminants so that those steps may be targeted for modification in the development of particle recipes. In another set of embodiments, multiple recipes are compared by using this technique to identify particle sources. More desirable recipes are thereby discriminated from less desirable recipes according to the relative particle levels that result from corresponding processing steps.

In different embodiments, the in situ particles are detected against a bright field or a dark field. These different embodiments may use different particle sensing techniques. In one embodiment, particles are detected against a bright field during one processing step and detected against a dark field during another processing step. The method may be used with high-density-plasma chemical-vapor-deposition substrate processing systems, in addition to other systems.

These techniques have been used in the development of improved process recipes. One example of such improvements is related to the frequency of a clean cycle when a process chamber is used to process multiple substrates. Particle contamination is significantly mitigated by using a cycle in which a single cleaning procedure is performed between deposition procedures on more than two substrates, provided the cleaning procedure is performed for a period of time greater than or equal to 150 seconds. Another example of an improvement is related to how the process chamber is purged for a cycle in which a silicate glass layer is deposited on a plurality of substrates. The cyclic process includes seasoning the process chamber, depositing the silicate glass layer by plasma deposition, purging the process chamber, and cleaning the process chamber. The purging is performed without a flow of SiH$_4$. In one embodiment, the plasma deposition uses substantially only side sources to provide the deposition gases to the chamber.

Methods of the invention may be embodied in a computer-readable storage medium having a computer-readable program embodied therein for directing operation of substrate processing system. Such a system may include a process chamber, a plasma generation system, a substrate holder, a gas delivery system, and a system controller. The computer-readable program includes instructions for operating the substrate processing system in accordance with the embodiments described above.

A further understanding of the nature and advantages of the present invention may be realized by reference to the remaining portions of the specification and the drawings.

BRIEF DESCRIPTION OF THE DRAWINGS

In the figures, similar components and/or features may have the same reference label. Where reference is made in the detailed description to a figure without specifying a particular subpart, the reference is intended to refer collectively to all subparts of the figure.

DESCRIPTION OF THE SPECIFIC EMBODIMENTS

I. Introduction

Figure 1A:
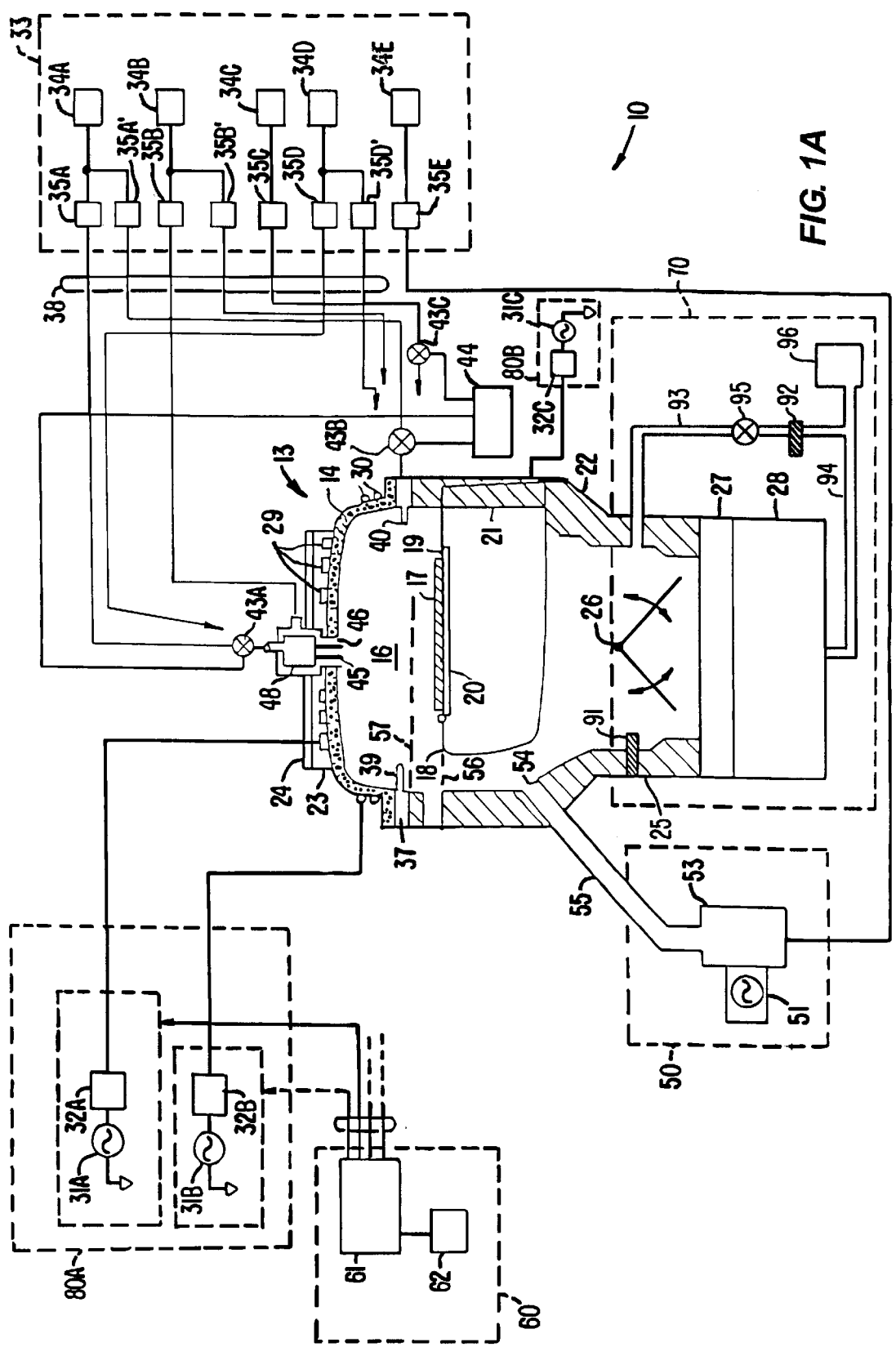
FIG. 1A is a simplified diagram of one embodiment of a high-density plasma chemical vapor deposition system according to the present invention.

Embodiments of the invention are directed to a method and system that use an in situ particle sensor to monitor manufacturing particle performance for plasma-based CVD systems in real time. In one embodiment, a brightfield sensor is used. Such a particle sensor is configured particularly to detect particles in a region exposed to significant illumination, such as in regions open to the light from the plasma. In another embodiment, a darkfield sensor, which is instead configured particularly to detect particles in regions away from significant sources of illumination, is used. Such an embodiment is useful for detecting particles in locations not exposed to light from the plasma.

The particle counts from the sensors allow the particle performance to be monitored in real time. This permits production to be halted immediately when a particle issue is detected, allowing a manufacturer to save significant amounts in what would otherwise be lost products. This provides the ability to discretize the process recipe steps and to correlate them with the particle performance on the sensor. In turn, individual process steps that contribute to particle problems can be identified. By having the data available during the process steps that are primarily responsible for particle issues, permits the process parameters and hardware components to be adjusted. Additional information allows the root causes for the contamination to be understood so that permanent changes can be made to address them. After changes have been made to the identified steps, subsequent particle-sensor results can be used to determine whether the changes have adequately resolved the particle issues.

As part of the real-time monitoring, different processing phases are examined, including deposition, clean, and season phases. During deposition of a wafer, the deposition gases released within the process chamber may cause unwanted deposition on other interior chamber surfaces, such as the walls of the chamber. This unwanted deposition may be a source of contaminant particles. Accordingly, the inside surface of the chamber is regularly cleaned to remove the unwanted deposition material from the interior chamber surfaces. This procedure is performed as a dry clean operation by exposing the chamber interior to an etchant gas such as $NF_3$. During the dry clean operation, the chamber interior is exposed to products formed by a plasma of the etchant gas that reacts with and removes the deposited material from the interior chamber surfaces. Such cleaning procedures are performed between deposition steps for every $n(\geq 1)$ wafers and referred to herein as "n×clean" processes.

This clean phase may itself be a source of particle accumulation. Fluorine from the clean plasma can be absorbed and/or trapped in the chamber walls and in other areas of the chamber, particularly those that include ceramic lining or other insulation material. The trapped fluorine may be released during subsequent deposition steps, such as by reacting with constituents from the plasma, and can contaminant deposited layers. To prevent such fluorine release and provide protection against other contaminants with interior chamber surfaces, the chamber is seasoned after the dry clean operation by depositing a thin layer over the interior chamber surfaces. In most of the embodiments described below, this season layer comprises a thin silicon oxide layer deposited from a process gas of $SiH_4$ and $O_2$.

II. Exemplary Substrate Processing System

FIG. 1A illustrates one embodiment of a high density plasma chemical vapor deposition (HDP-CVD) system 10 in which a substrate can be processed according to the present invention. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (shown in FIG. 2) are raised and then lowered under the control of a motor (not shown) to move the substrate to different positions within the chamber 13. The lift pins may be configured to move the substrate from the robot blade at an upper loading position 57 to a pre-processing position 58 where, as explained further below, the substrate is prepared for processing. Subsequently, the lift pins may move the substrate to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26, and uses two distinct pumping ports. The throttle body is attached to gate valve 27 and turbo-molecular pump 28, and is also configured for pumping by dry pump 96. The throttle body is connected with the dry pump through tube 93 and the turbo-molecular pump is connected with tube 94. Control over the dry pumping port is exercised with roughing throttle valve 95. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr. Brightfield particle sensor 91 is positioned within the throttle body 25, where it is exposed to light from the plasma within the chamber 13. Darkfield particle sensor 92 is positioned along tube 92 after the roughing throttle valve 95, where it is isolated from the plasma light.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 5,000 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF ("BRF") generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
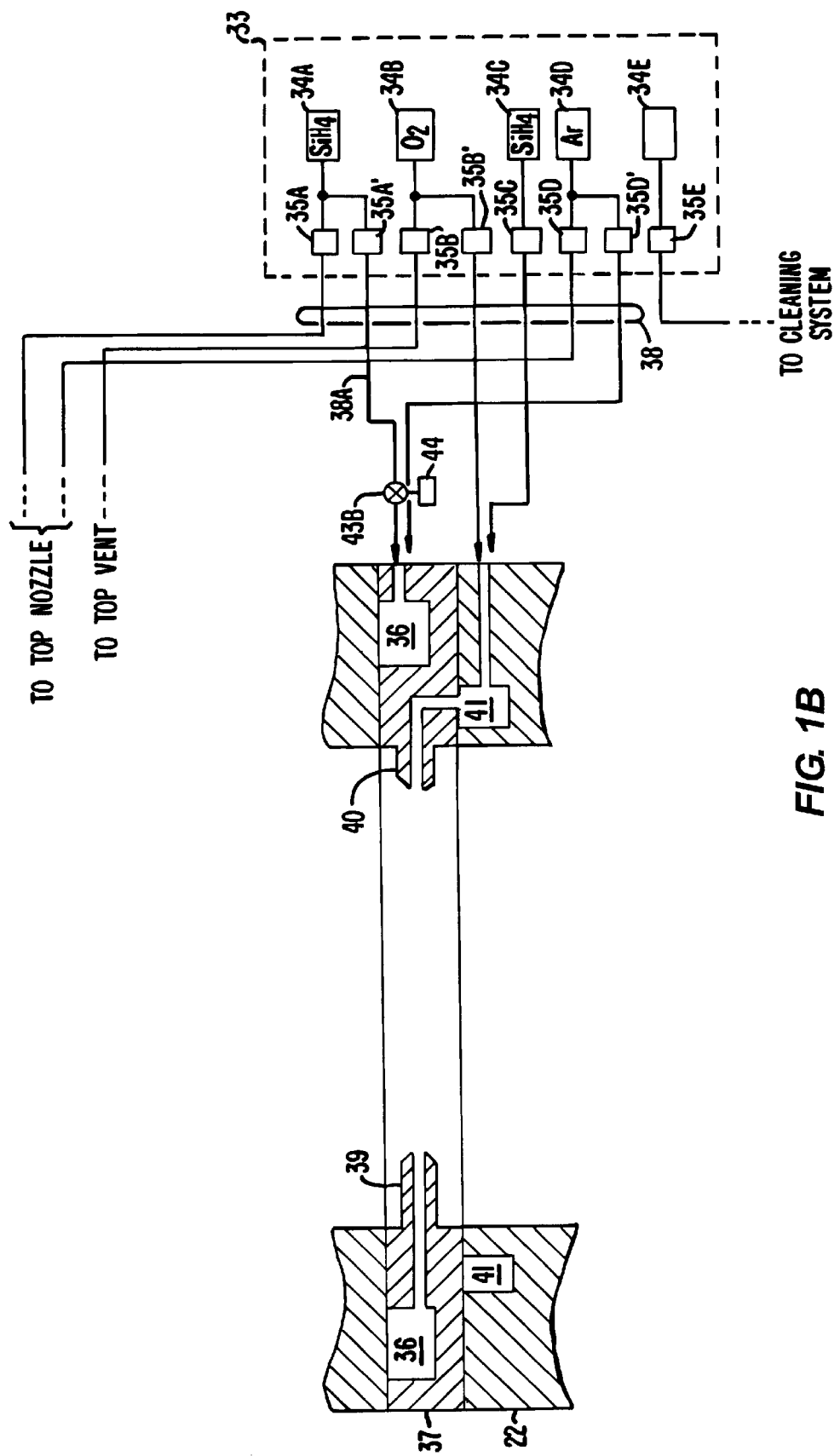
FIG. 1B is a simplified cross section of a gas ring that may be used in conjunction with the exemplary CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves layer uniformity and allows fine adjustment of the layer's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process. In one embodiment, this cleaning system is used to dissociate atoms of the etchant gas remotely, which are then supplied to the process chamber 13. In another embodiment, the etchant gas is provided directly to the process chamber 13. In still a further embodiment, multiple process chambers are used, with deposition and etching steps being performed in separate chambers.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 65, and a light pen 66, as depicted in FIG. 1C.

Figure 1C:
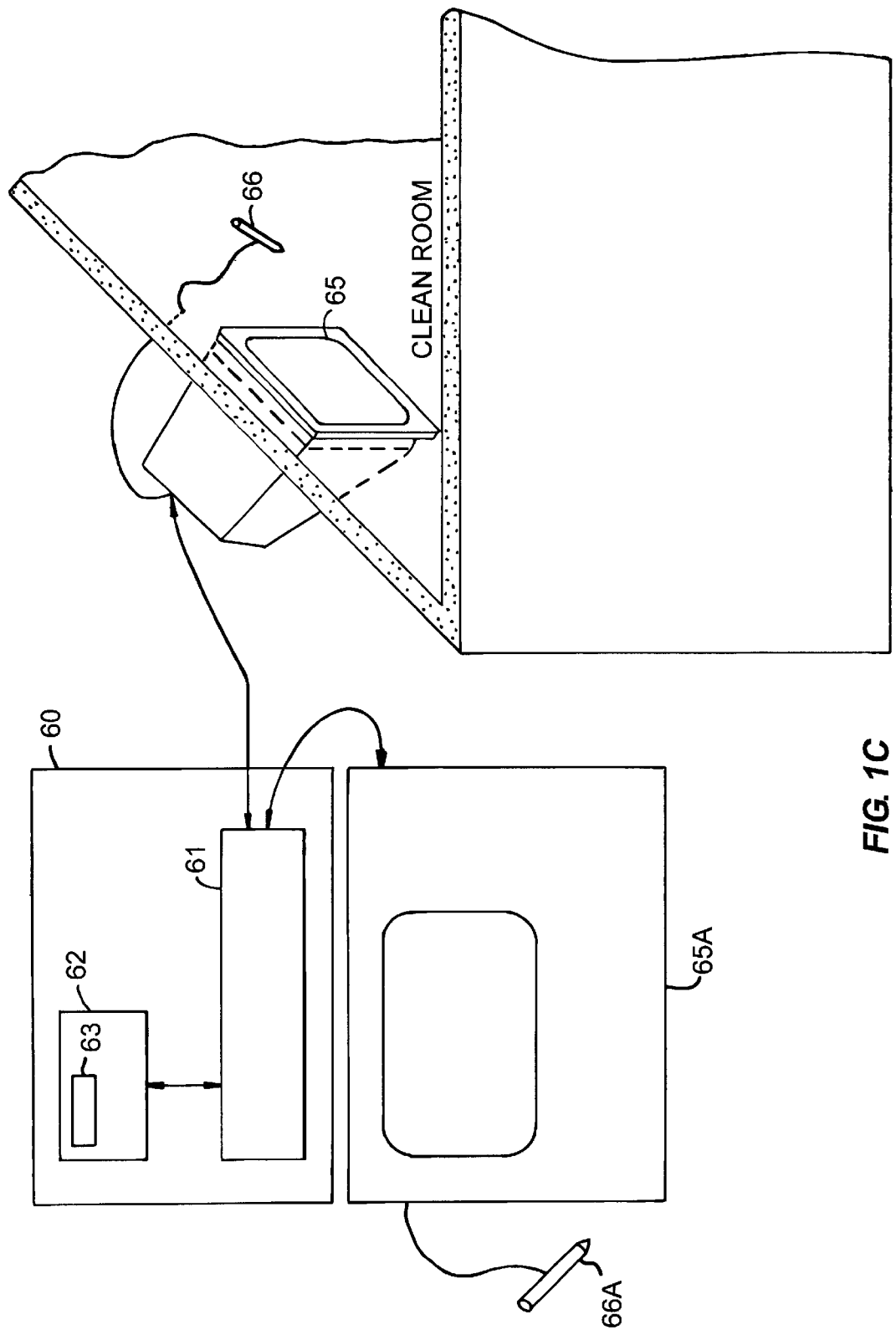
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66)

is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
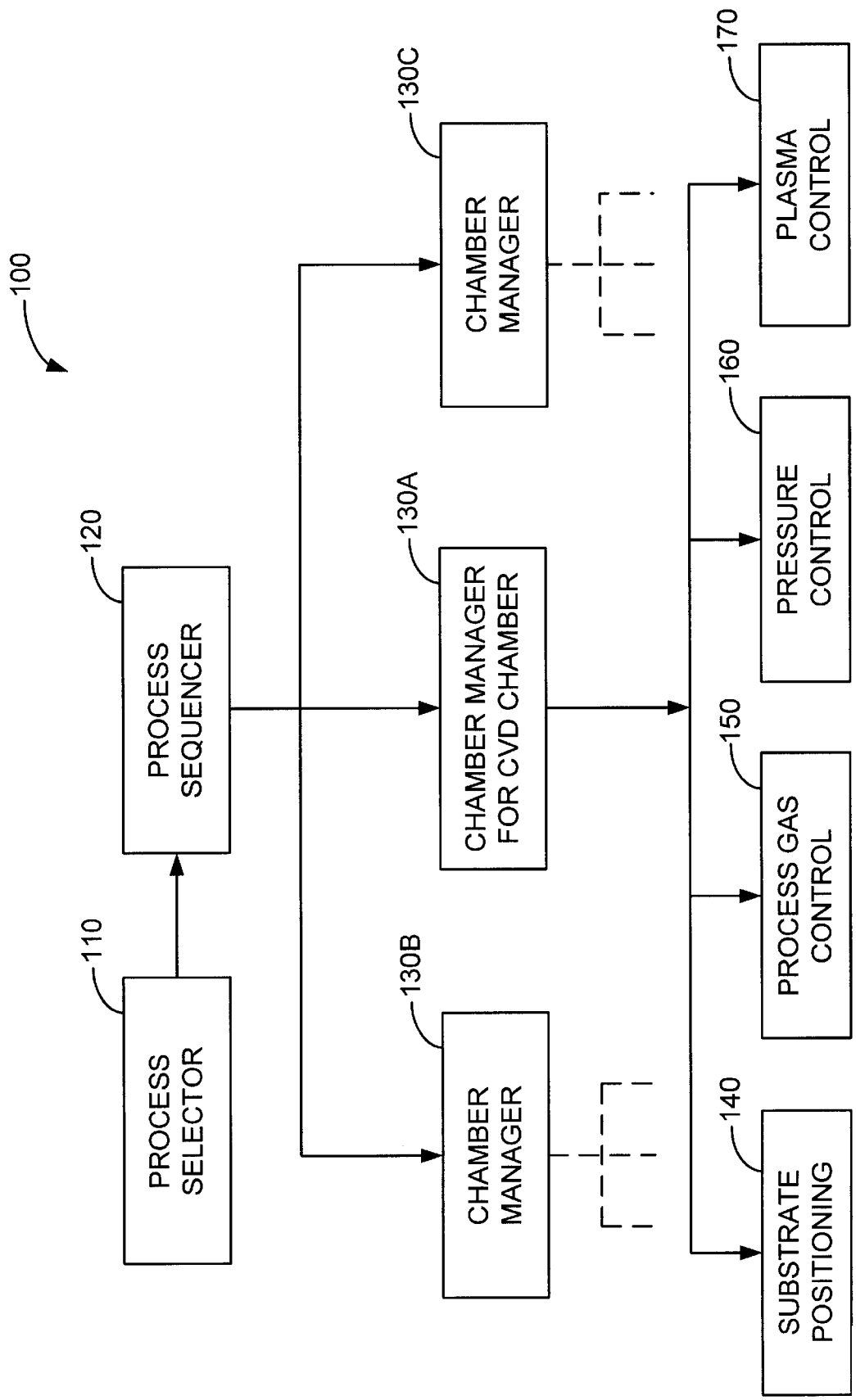
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 140, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a plasma-enhanced CVD ("PECVD") reactor or other reactor in the multichamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in the commonly assigned U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. Particle Sensors a. Brightfield Particle Sensor

Figure 2A:
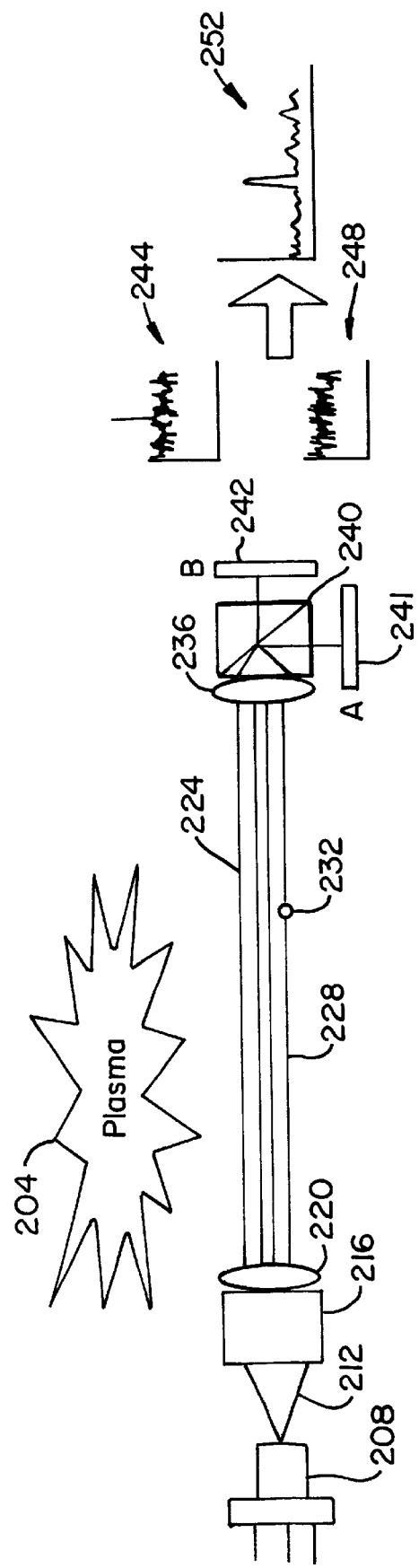
FIG. 2A is a schematic illustration of the functioning of a brightfield sensor.

The operation of one brightfield particle sensor 91 that may be used with embodiments of the invention is shown in FIG. 2A. Such a brightfield particle sensor 91 is available commercially from the HYT line of products produced by Pacific Scientific Instruments Co., such as HYT Model 9000 providing a particle detection limit of about 0.30 $\mu$m. The sensor 91 includes a visible semiconductor laser diode source 208. An optical arrangement that includes a polarizer 216 and a lens 220 is provided to focus the beam 212 produced by the laser diode source 208 into a pair of orthogonally polarized beams 224 and 228. A second optical arrangement includes a lens 236 to focus the polarized beams and a signal split 240 to direct each of the beams respectively to different detectors 241 and 242. The differential of the two signals received by detectors 241 and 242 is analyzed for the presence of a particle.

In this manner, the effect of a bright ambient field, such as may be provided by the plasma 204 in the plasma chamber, is canceled because the unpolarized light creates an approximately equal signal on both detectors. By contrast, the presence of a particle 232 in one of the beams changes its polarization, causing a peak when the signal is received at the detector. Generally, a particle 232 will not intersect both of the beams simultaneously, although a moving particle may intersect one of the beams and then subsequently intersect the other beam.

In the example shown in FIG. 2A, a particle 232 intersects beam 228. As a result, spectrum 244 detected by detector 242 includes a nonzero background noise level caused by the plasma light, together with a peak that corresponds to the particle. Spectrum 248 detected by detector 241 includes only the background noise. When these spectra are subtracted to produce spectrum 252, the background noise approximately cancels so that it is at a low level and the peak due to the presence of the particle 232 can be clearly identified.

b. Darkfield Particle Sensor

Figure 2B:
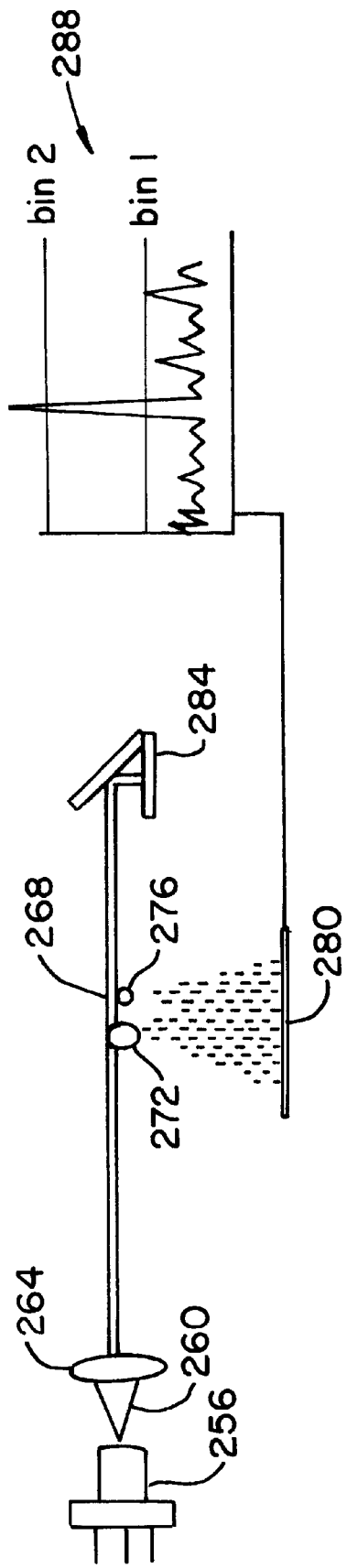
FIG. 2B is a schematic illustration of the functioning of a darkfield sensor.

FIG. 2B similarly illustrates the operation of one darkfield particle sensor 92 that may be used with embodiments of the invention. One appropriate darkfield particle sensor is the HYT Model 70XE available from Pacific Scientific Instruments Co., which provides a particle detection limit of about 0.17 $\mu$m. The darkfield sensor 92 includes a semiconductor laser diode source 256 and a lens 264 to focus the beam 260 provided by the laser diode source 256. The focused beam 268 is directed to a beam stop 284. A plurality of photocells 280 is provided around the focused beam 268 such that light will be detected when scattered from the focused beam 268 by the presence of a particle.

Examples are shown for two particles in FIG. 2B, a large particle 272 and a smaller particle 276. The amount of light detected by the photocells 280 is correlated with the size of the particle in the beam since larger particles will scatter more light. The photocell signal is amplified to produce sample spectrum 288, which shows that peaks for detected particles may be of different heights. Binning lines, denoted "bin 1" and "bin 2" may be used to provide a semiquantitative estimate of the size of the particle, with signals falling between "bin 1" and "bin 2," for example, corresponding to particles within a certain approximate size limit. The commercially available HYT Model 70XE provides binning for five approximate size ranges.

IV. Process Diagnosis

The in situ particle sensors permit characteristics of individual steps within a recipe to be analyzed. This is contrasted with the technique of examining the wafer surface after deposition for the presence of particles, which gives only a global indication of the result of the entire recipe. A number of examples are provided below illustrating how the measurements from the in situ particle detectors permit the effects of individual steps of recipes to be understood and for recipes to designed or adapted to mitigate undesirable effects and take advantage of desirable effects.

a. Identification of Particle-contamination Sources

Figure 3A:
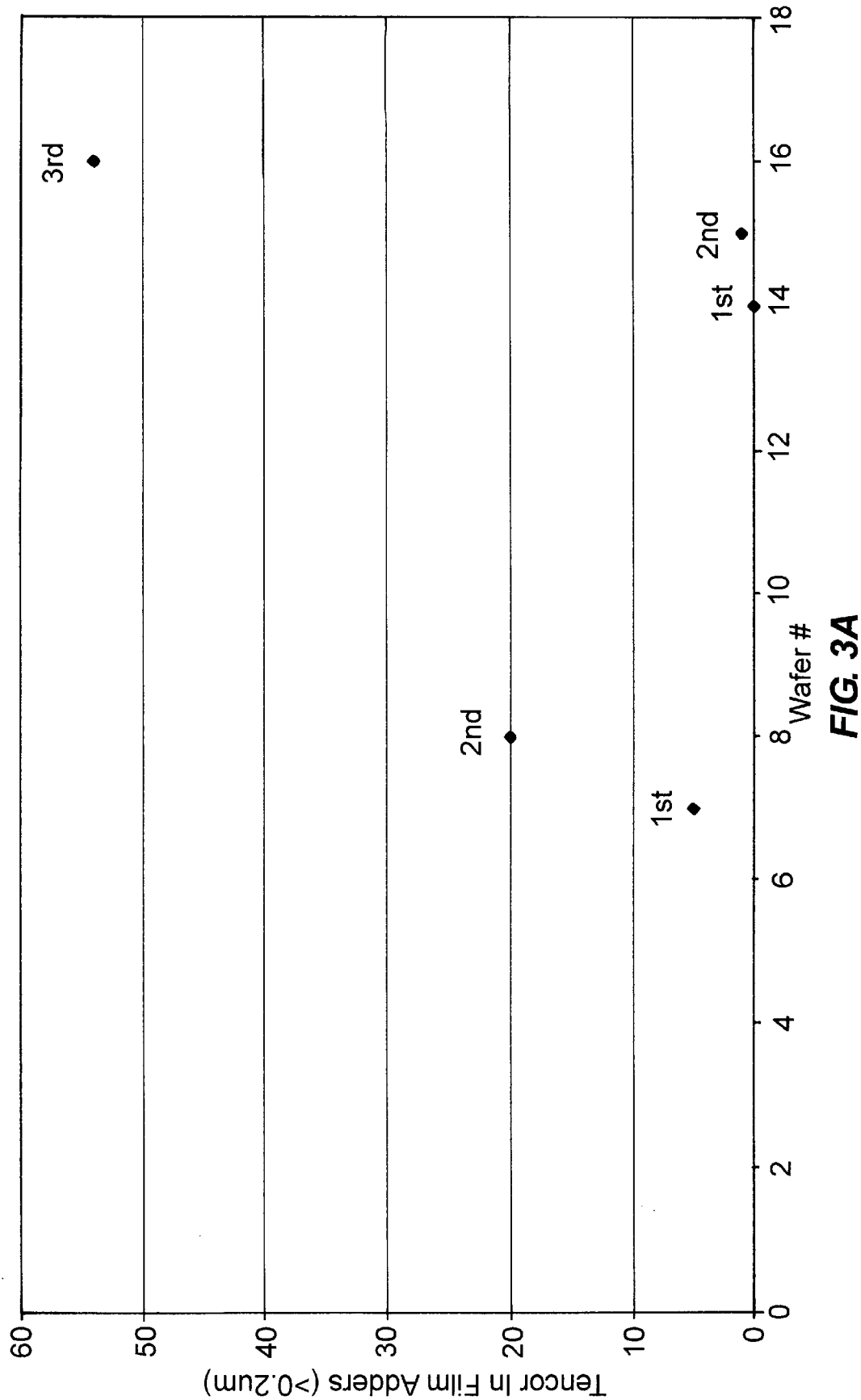
FIG. 3A shows post-deposition particle measurements of wafers deposited with 14 kÅ of FSG in 2×clean and 3×clean processes.

One application of the in situ particle sensors permits the identification of sources for particle contamination in wafers. For example, in a 3× clean process, whereby deposition processes are run on three wafers for every cleaning process in a chamber, it was generally observed that the third wafer was high in particle contamination. For example, FIG. 3A shows the results of particle measurements using a Tencor 6420 optical scanning surface inspection system on processed wafers as a particle sensor. The Tencor 6420 system is sensitive to particles having a diameter greater than 0.2 $\mu$m. Results are shown for deposition of 14-kÅ layers of fluorinated silicate glass ("FSG") for two different processes: a 3×clean, with a cleaning process time of 145 seconds, and a 2×clean in which only two wafers are processed for each clean, with a cleaning process time of 110 seconds.

The results for the 2×clean are shown for wafer numbers 7 and 8, while the results for the 3×clean are shown for wafer numbers 14, 15, and 16. These results from the particle analysis of processed wafers show only that the third wafer in the 3×clean process has high particle levels, but provides no insight as to the underlying mechanism producing the contamination. Accordingly, one approach that had been used was to limit the number of wafers for each clean, often to a single wafer per clean. Such a solution is inefficient, raising the individual cost and time for wafer processing.

Figure 3B:
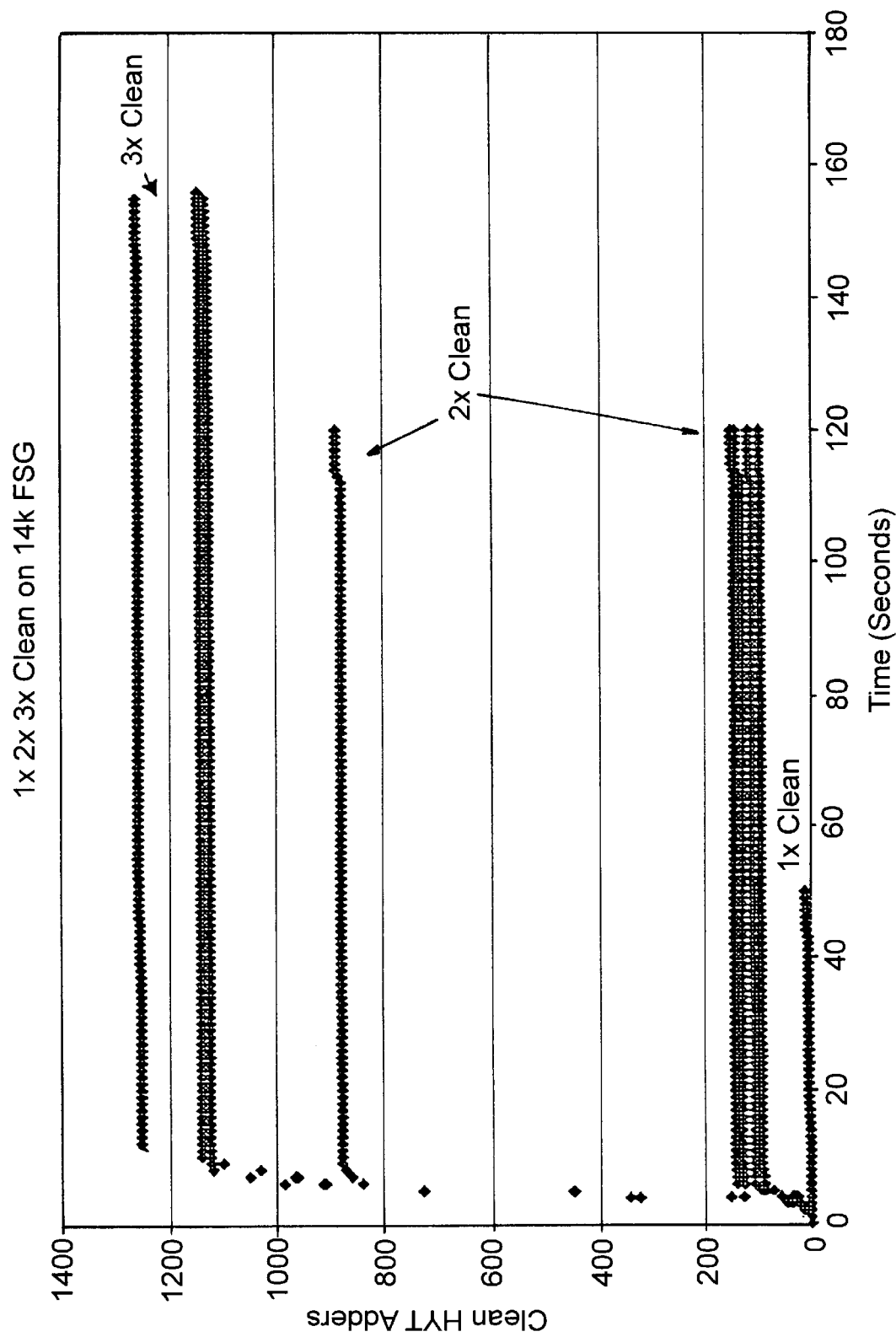
FIG. 3B shows in situ particle measurements of wafers deposited with 14 kÅ of FSG in 1× clean, 2× clean, and 3× clean processes.

In FIG. 3B results are shown for in situ particle sensors as a function of time for 1×clean, 2×clean, and 3×clean processes. These results provide details of the process, showing that the particles occur within approximately the first ten seconds of the clean process. This finding suggests that deposition on the inner surfaces of the chamber actually flakes during the deposition process, but does not fall down to the pumping port to be picked up by the deposition component of the particle sensor. Since the clean process operates at a higher pressure than the deposition process, the flakes find their way to the pumping port. These results suggest that an increase in cleaning time may reduce particle contamination even for a 3×clean process.

An alternative method for increasing efficiency was described in the '800 application by seasoning a process chamber with a layer of silicon instead of with silicon oxide. For that application, the use of in situ particle detectors aided in quantifying the particle levels for silicon oxide seasoning to provide a point of comparison with silicon seasoning.

Figure 4A:
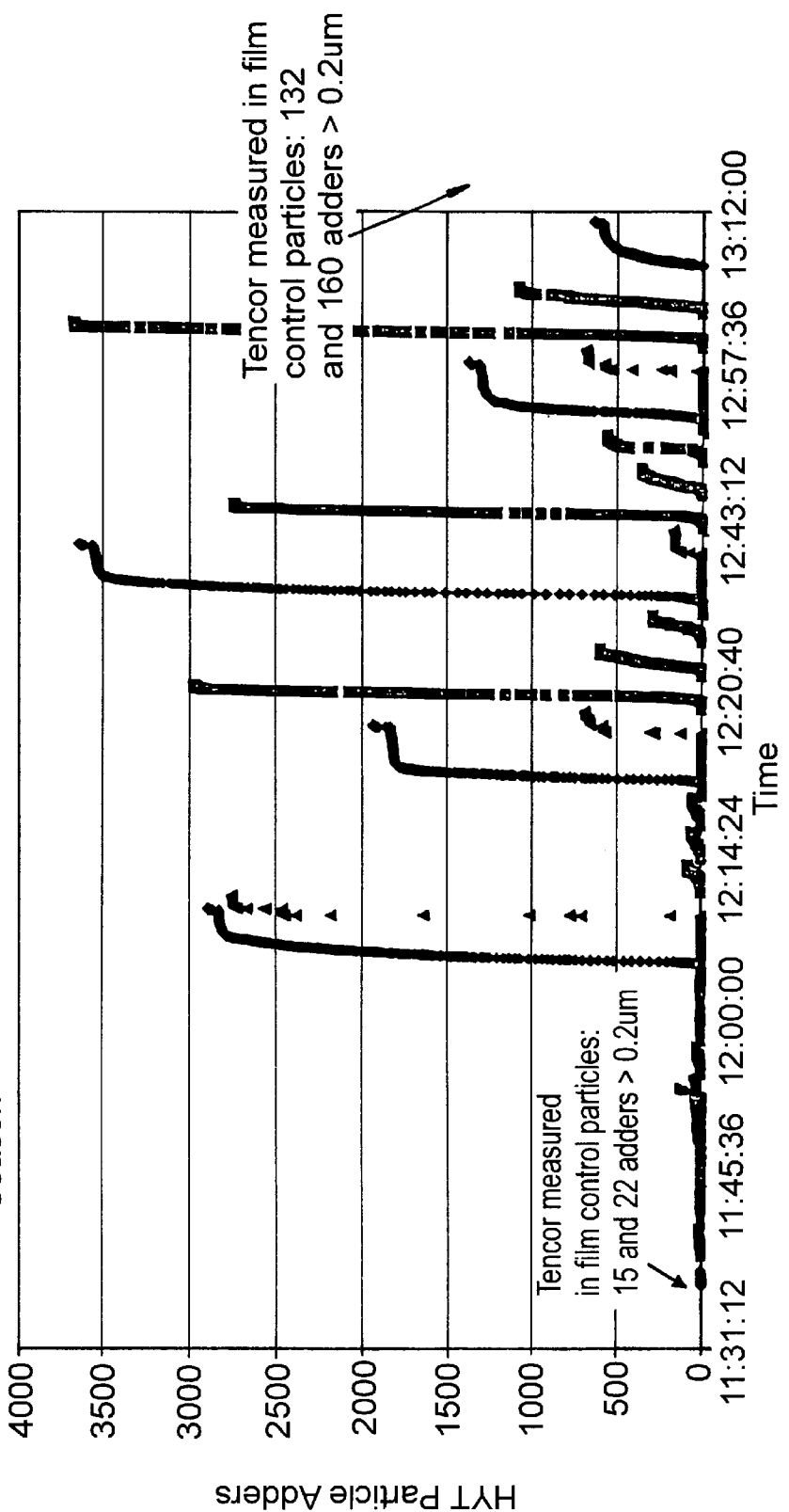
FIG. 4A shows time-dependent particle-sensor results for clean, deposition, and seasoning phases of a recipe.

FIGS. 4A–4G illustrate the results of a further investigation into the effect of cleaning time by studying a 3×clean process for deposition of a 1-$\mu$m layer of FSG. In FIG. 4A, particle results are presented over time and are categorized according to clean, deposition, and seasoning phases of a particular recipe having a clean time of 100 seconds, each such phase being denoted respectively with diamonds, squares, and triangles. The clean results are determined by measurements from the darkfield sensor and the deposition and season results are determined from brightfield-sensor measurements. The in situ measurements are correlated with ex situ measurements using a Tencor 6420 optical scanning system.

The wafers initially show little contamination as determined through ex situ measurements, with between 15 and 22 adders observed for >0.2 $\mu$m particles. As wafers are processed using the 3×clean process, initially detect few particles in any of the three phases (e.g., at "11:45:36" or at "12:00:00"). After a period of processing, however, a sharp increase in the presence of particles is noted during the clean and season phases (e.g., near "12:14:24"). This increase is then also manifested in the deposition phases, beginning at "12:14:24," with large levels of particles being observed in all subsequent deposition phases. After six 3×clean cycles, ex situ measurements of the wafers show particle contamination between 132 and 160 adders for >0.2 $\mu$m particles, an increase of approximately 700% from the initial values.

Figure 4B:
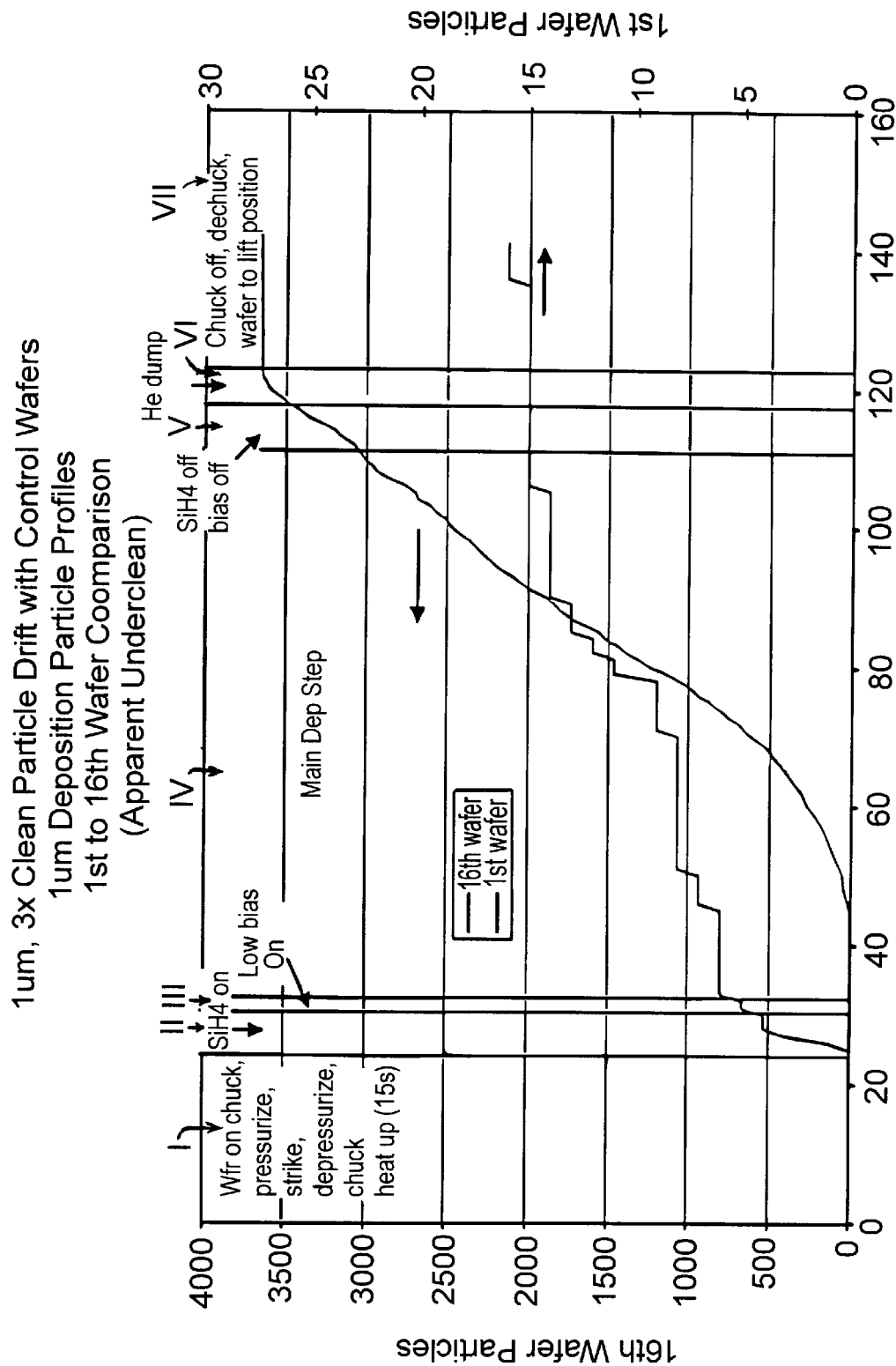
FIG. 4B shows deposition-particle profiles for the first and sixteenth wafers in a 3× clean process.

The detailed time behavior provided by the in situ particle monitors suggests that the clean time is insufficiently long. This inference is reinforced by the results presented in FIG. 4B, which shows deposition-particle profiles for the first and sixteenth wafers in a 3×clean process. The time periods for the individual recipe steps are noted on the graph according to seven distinct phases I–VII. In phase I, the wafer and chamber are prepared, silane $SiH_4$ is introduced in phase II and an RF bias is applied in phase III. The major portion of the process is then the main deposition step of phase IV, which is followed by stopping silane flow and turning the RF bias off in phase V. A helium dump occurs in phase VI and the wafer is removed from the chamber is phase VII. In FIG. 4B, the in situ particle measurements for the first wafer are shown by the right-hand scale and are everywhere less than 20 adders. By contrast, for the sixteenth wafer, the in situ particle measurements are shown by the left-hand scale and exceed 3000 adders. The in situ particle results thus suggest that particle contamination results from insufficient cleaning of the chamber in the 3×cycle.

Figure 4C:
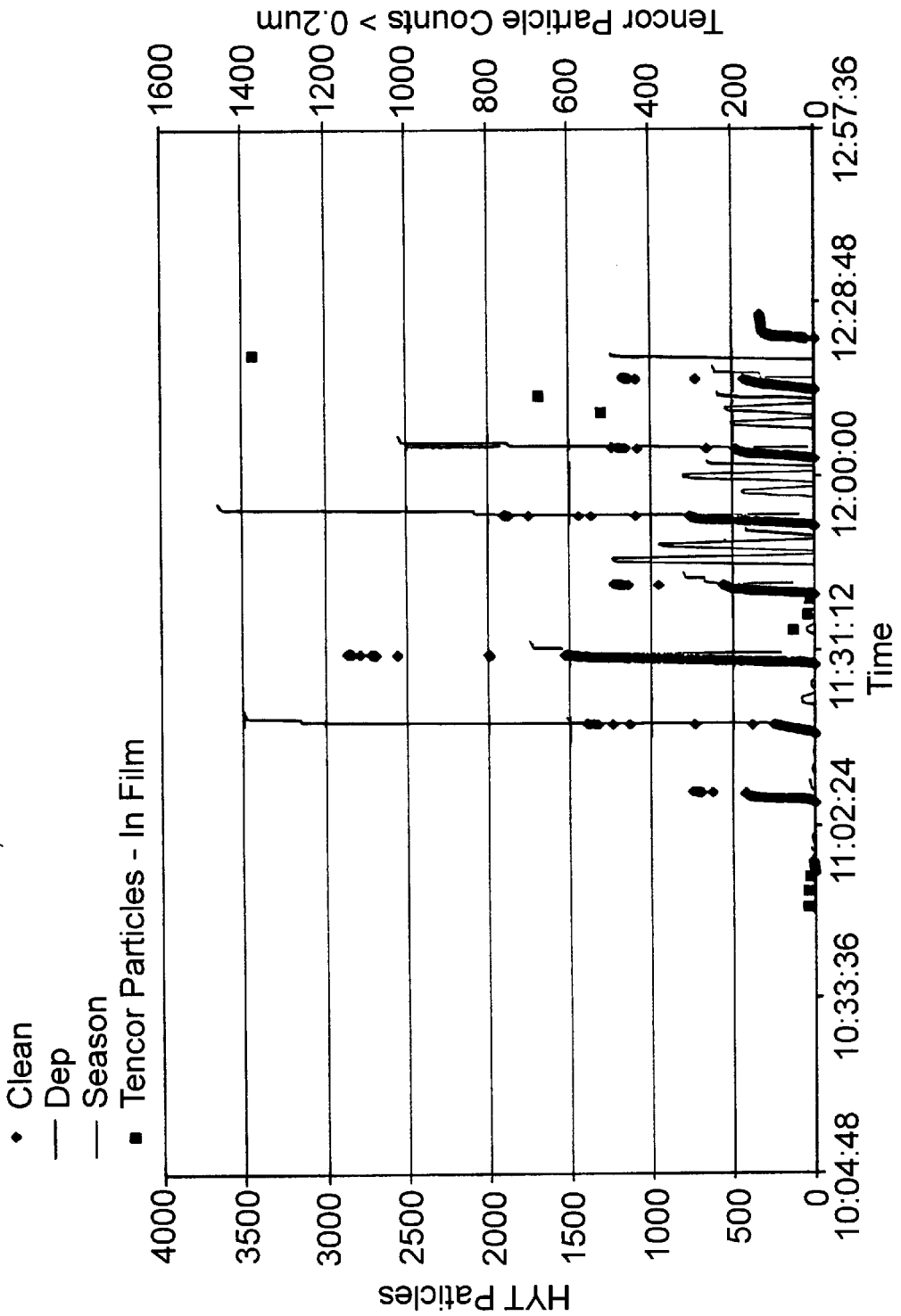
FIGS. 4C–4E show time-dependent particle-sensor results for clean, deposition, and seasoning phases of a recipe in which the clean time is adjusted.
Figure 4D:
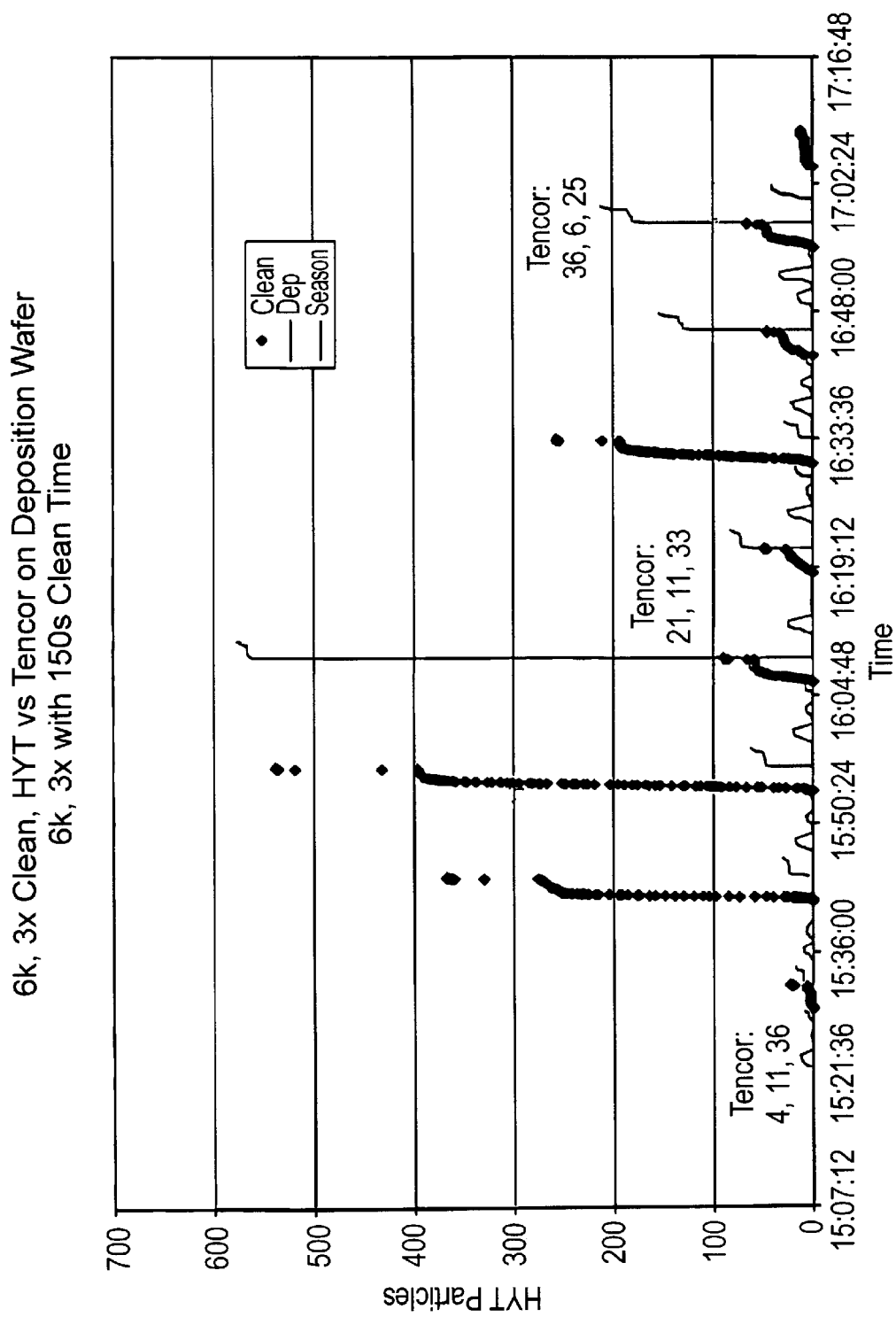
Figure 4E:
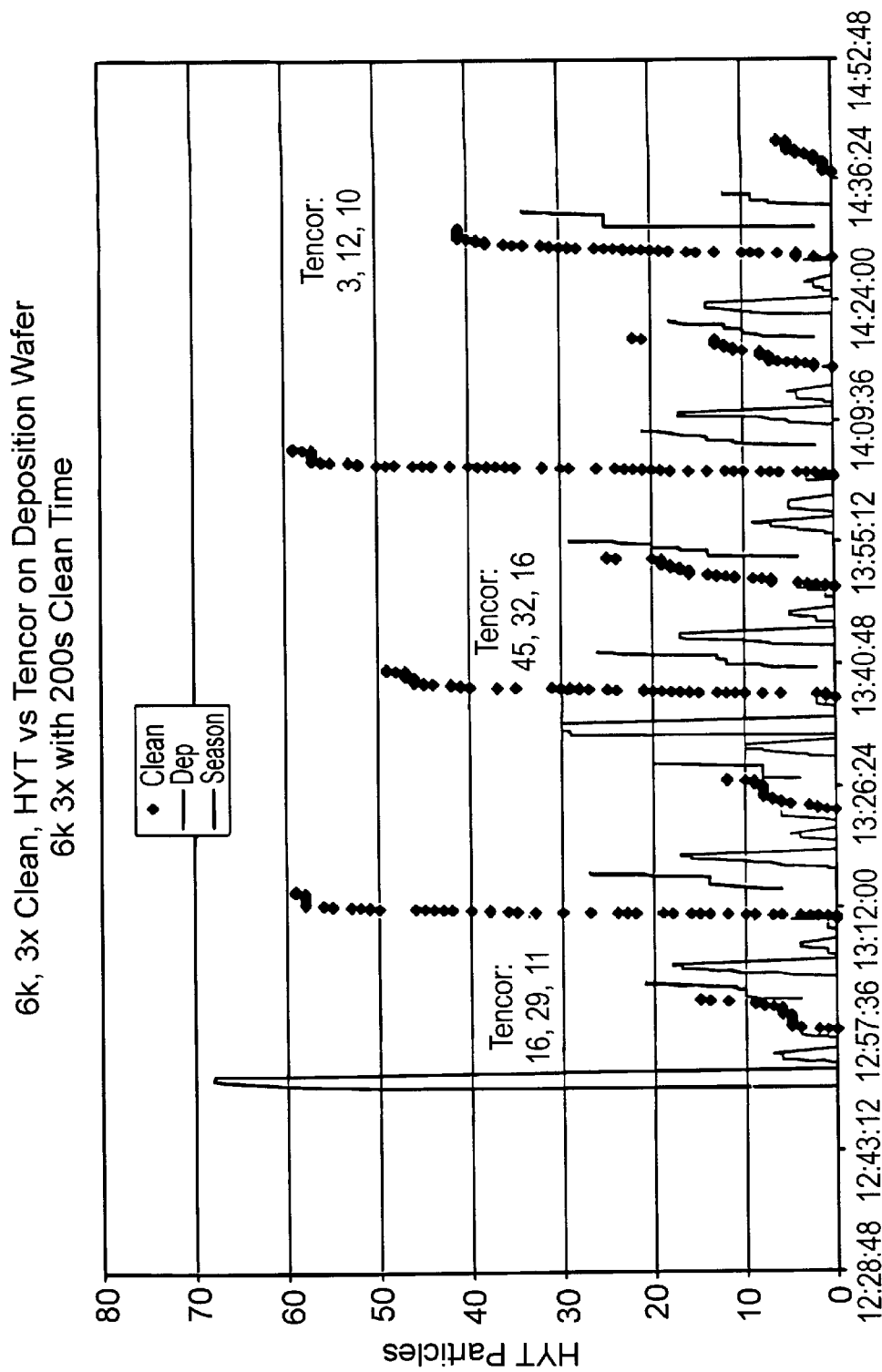
Figure 4F:
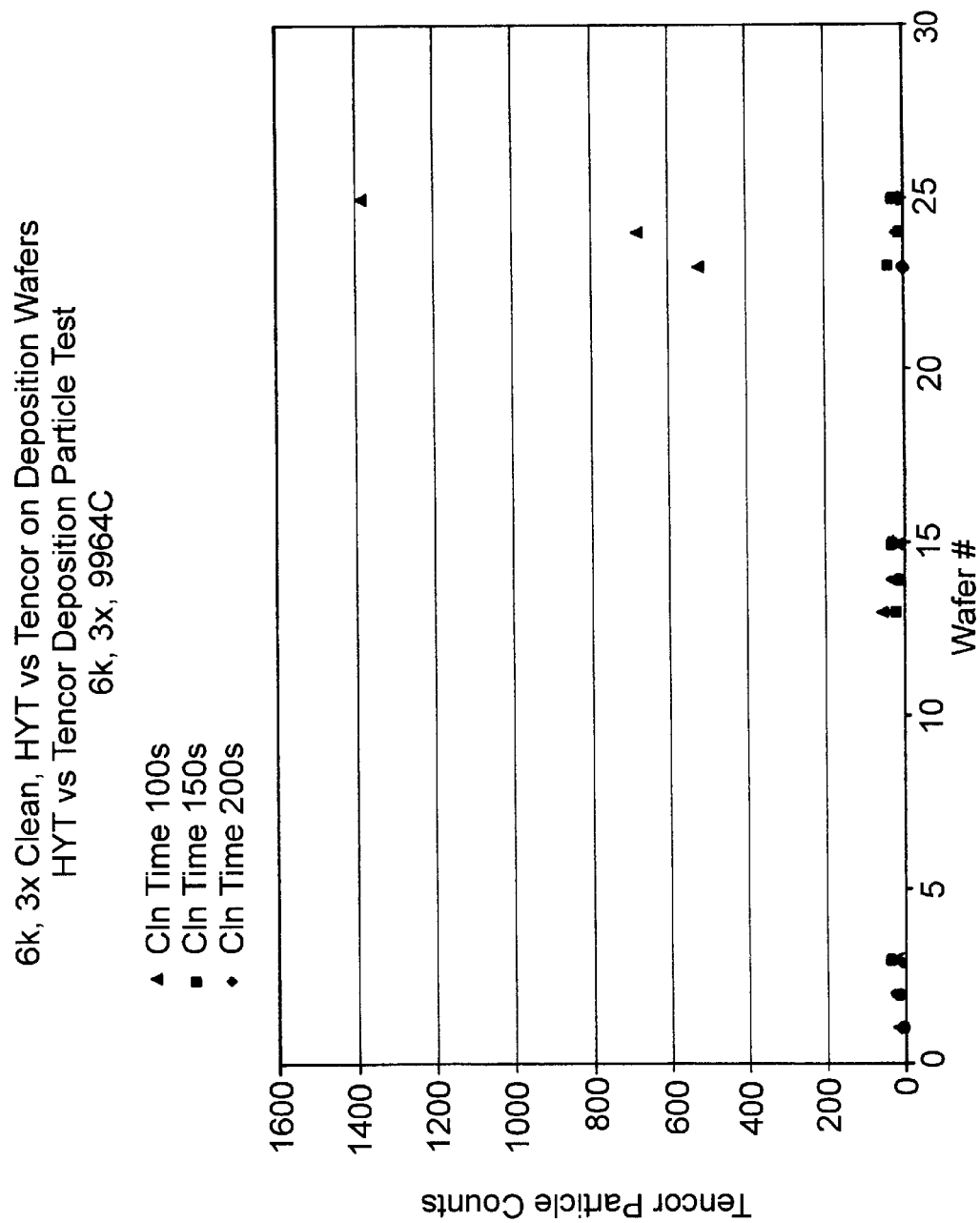
FIG. 4F shows ex situ particle measurements as a function of the number of wafers processed for different clean times.

Thus rather than require that a clean step be performed for each deposition phase, the in situ particle results suggest that the particle contamination may instead be reduced by increasing the clean time while still retaining the 3× clean cycle. A simple increase in clean time is a preferable solution because it retains the efficiency and cost benefits provided by the 3×clean cycle. FIGS. 4C–4E show results of tests conducted to compare in situ particles for deposition of 6-kÅ FSG layers with 3×clean cycles for varying clean times. FIG. 4C shows results for a 25-wafer run with a 100-s clean time, FIG. 4D shows results for a 25-wafer run with a 150-s clean time, and FIG. 4E shows results for a 15-wafer run with a 200-s clean time. In each instance, the results are correlated with ex situ measurements performed with a Tencor 6420 optical scanning system. In FIG. 4C, the ex situ results are denoted with squares and a right-handed ordinate scale, while in FIGS. 4D and 4E, the ex situ results are provided with text on the figure for each of three wafers in given 3×clean cycles.

Figure 4G:
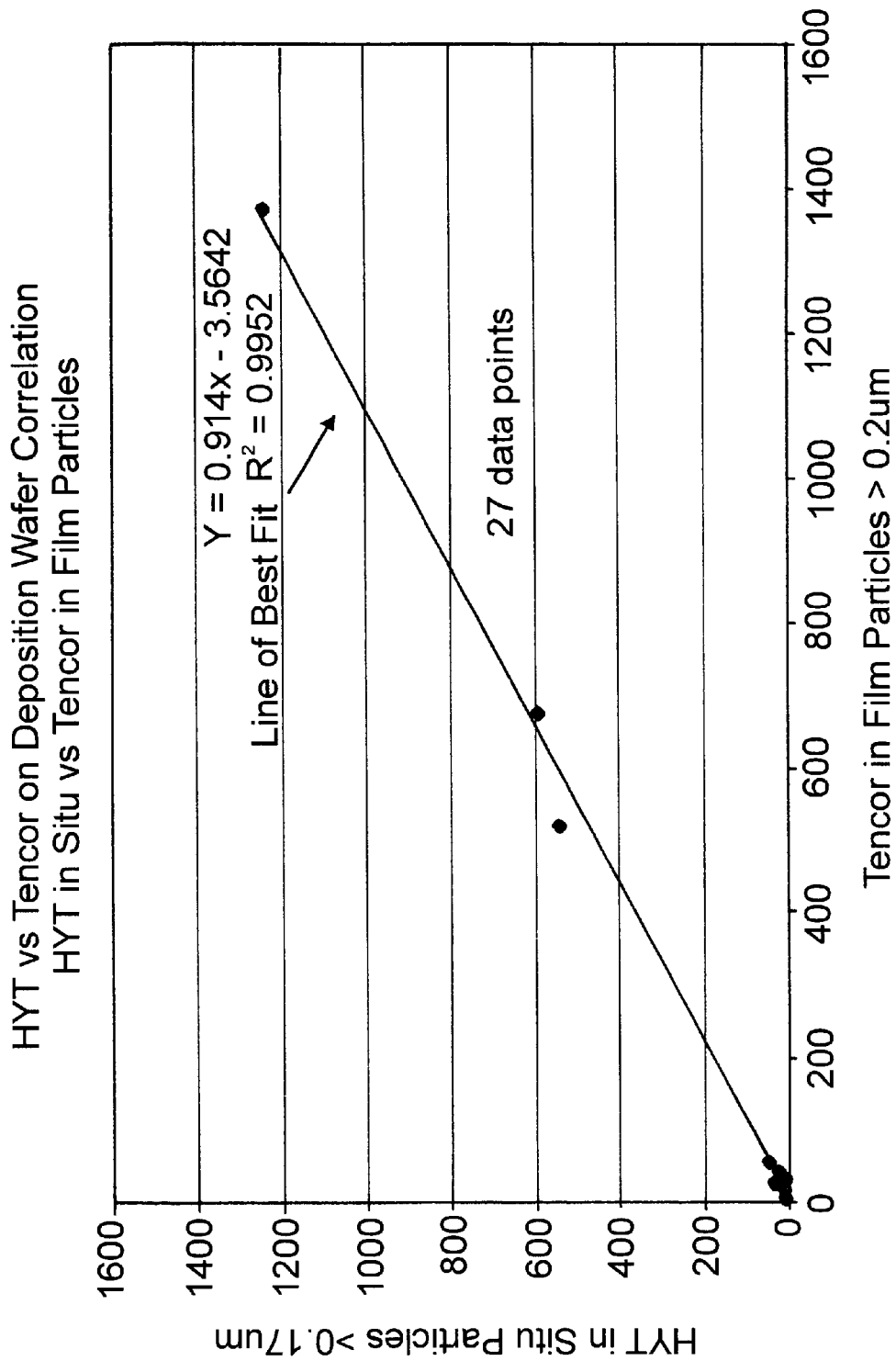
FIG. 4G shows the correlation between in situ and ex situ particle measurements.

The particle levels systematically decrease with the increase in clean time, with almost two orders of magnitude difference between the 100-s and 200-s clean times. In FIG. 4C, the in situ deposition particles reach almost 1500 adders in some instances with clean times of 100 s. In FIG. 4E, the in situ deposition particles are almost everywhere less than 30 adders when clean times are extended to 200 s. The ex situ results are summarized graphically in FIG. 4F as a function of the number of wafers processed. The 100-s clean times result in significantly greater particle contamination than do the longer clean times. In particular, high particles are seen in the ex situ results by the 23rd wafer run for the 100-s clean time, but no significant rise is seen for the 150-s and 200-s clean times. FIG. 4G summarizes the correlation between the in situ and ex situ measurements by showing that a line may be fit having a correlation $R^2=0.9952$.

To summarize, the in situ particle measurements provided a basis, not otherwise available from ex situ particle measurements, for identifying recipe features that contributed to particle contamination, namely the length of the clean step. Such information was then used to modify the recipe in a way that improved the process and which was not evident from the ex situ particle measurements.

b. Modification of Other Process Steps

The in situ particle measurements also provide information that may be used in evaluating other process steps. An example of such a study is shown in FIGS. 5A–5F. The study was conducted for deposition of an 8-kÅ FSG layer using a 3×clean process. The recipe included the following steps: shown in Table I: (1) cleaning steps; (2) a deposition step; (3) a $SiH_4$ purge step, (4) an Ar microwave purge step, and (5) a season step. In Table I, when two numbers are given with one following a "+," the first number refers to the contribution from side sources and the second number refers to the contribution from top sources. The effect on particle contamination was examined for a 30-s $SiH_4$ purge, a 0-s $SiH_4$ purge, a 0 sccm Ar microwave purge, and the effect of restricting the flow of $O_2$ during the deposition step to side sources rather than top sources.

particle counts. The 0-s $SiH_4$ purge has no instances of very large particle counts and has very low clean-process particles. The 0-sccm microwave Ar purge drops the deposition baseline significantly and has no instances of very large particle counts while significantly raising the clean-particle baseline. These results are summarized in the following table, which indicates the median and maximum measured values for particle counts:

TABLE II

| | | In situ Particle Count | |
|---|---|---|---|
| Process Phase | Recipe | Mean | Maximum |
| Deposition | Standard | 30.5 | 268 |
| | 30-s $SiH_4$ Purge | 49 | 123 |
| | 0-s $SiH_4$ Purge | 38 | 84 |
| | 0-sccm Ar Microwave Purge | 20.5 | 48 |
| Clean | Standard | 538 | 2620 |
| | 30-s $SiH_4$ Purge | 656 | 892 |
| | 0-s $SiH_4$ Purge | 104 | 175 |
| | 0-sccm Ar Microwave Purge | 1207.5 | 2192 |
| Season | Standard | 39.5 | 199 |
| | 30-s $SiH_4$ Purge | 29 | 118 |
| | 0-s $SiH_4$ Purge | 18 | 25 |
| | 0-sccm Ar Microwave Purge | 19 | 33 |

By superimposing the in situ particle-sensor data with the process recipe step timing, a better understanding of what steps within the process contribute to particles on the wafer is provided. Once identified, these steps can be further investigated as part of the development of processes that are more robust overall. One example is provided in FIG. 5E, in which a composite median of cumulative in situ particle counts is provided for eight seasons, for the three cleaning times. In each case, it is evident that the Ar microwave purge step causes the release of a significant number of particles into the system. Using this procedure, it has additionally been identified that limiting $O_2$ to side sources also provides an improvement in limiting particle contamination.

Figure 5A:
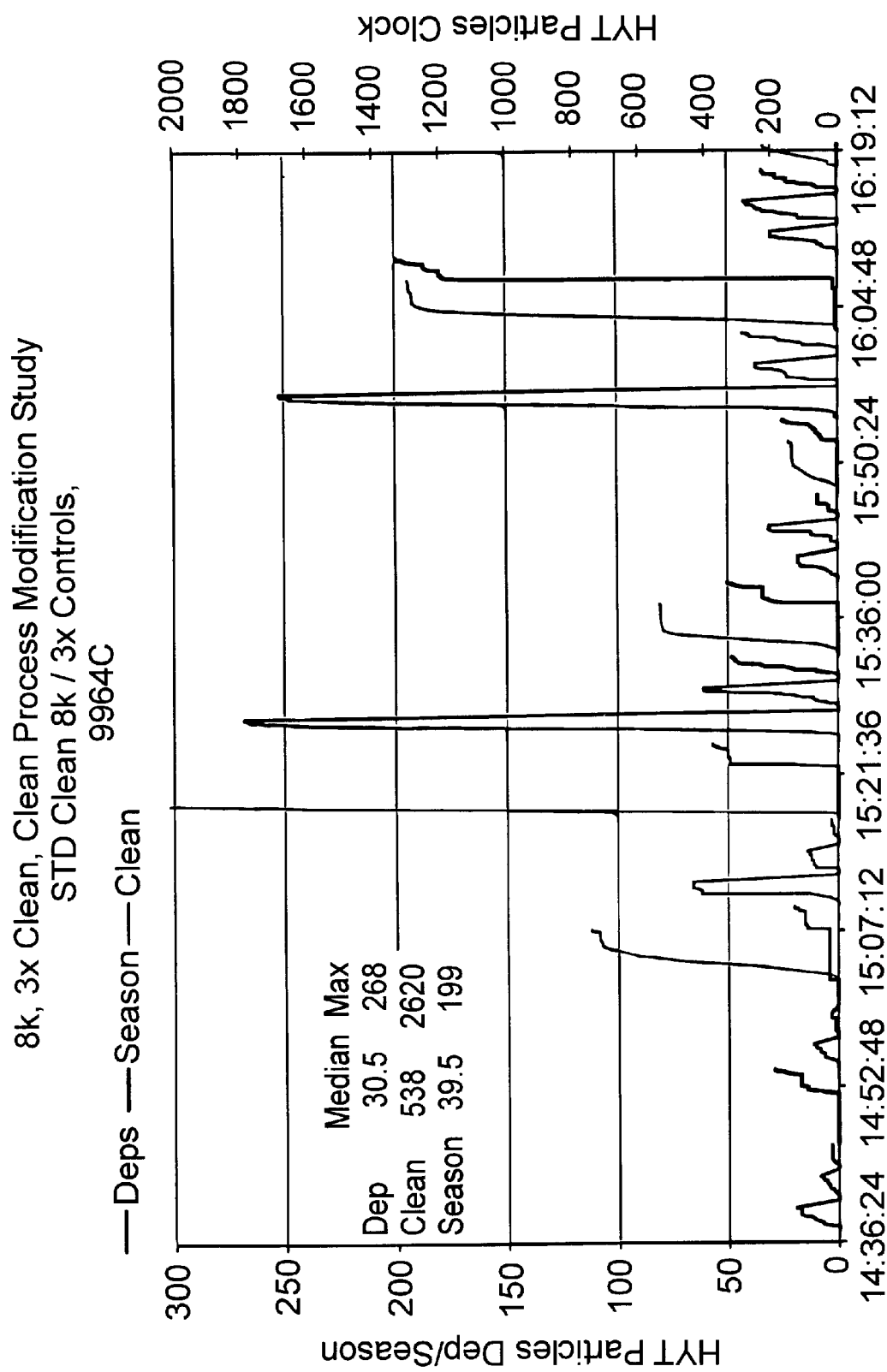
FIGS. 5A–5D show time-dependent particle-sensor results for clean, deposition, and seasoning phases for a recipe with different variations.
Figure 5B:
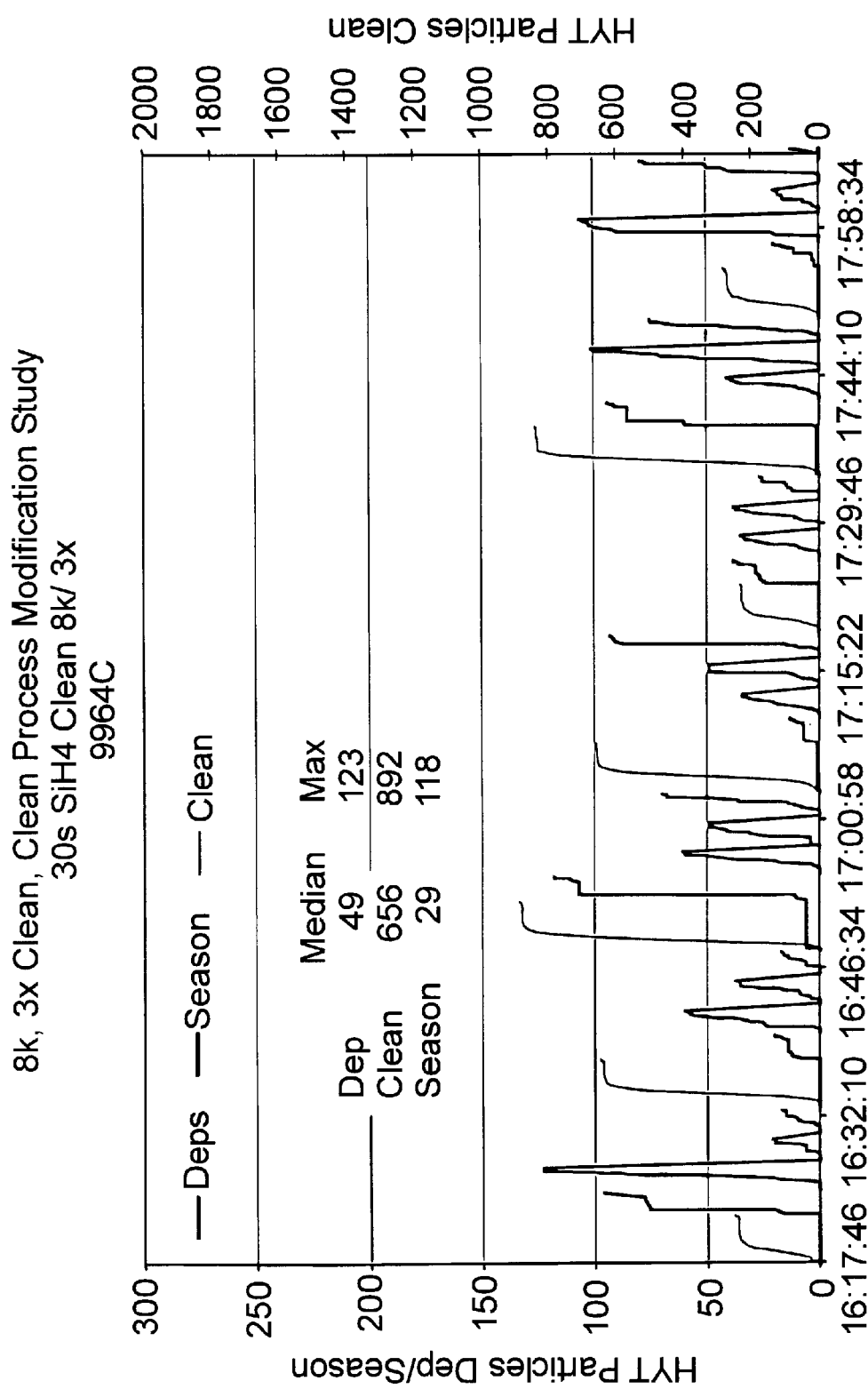
Figure 5C:
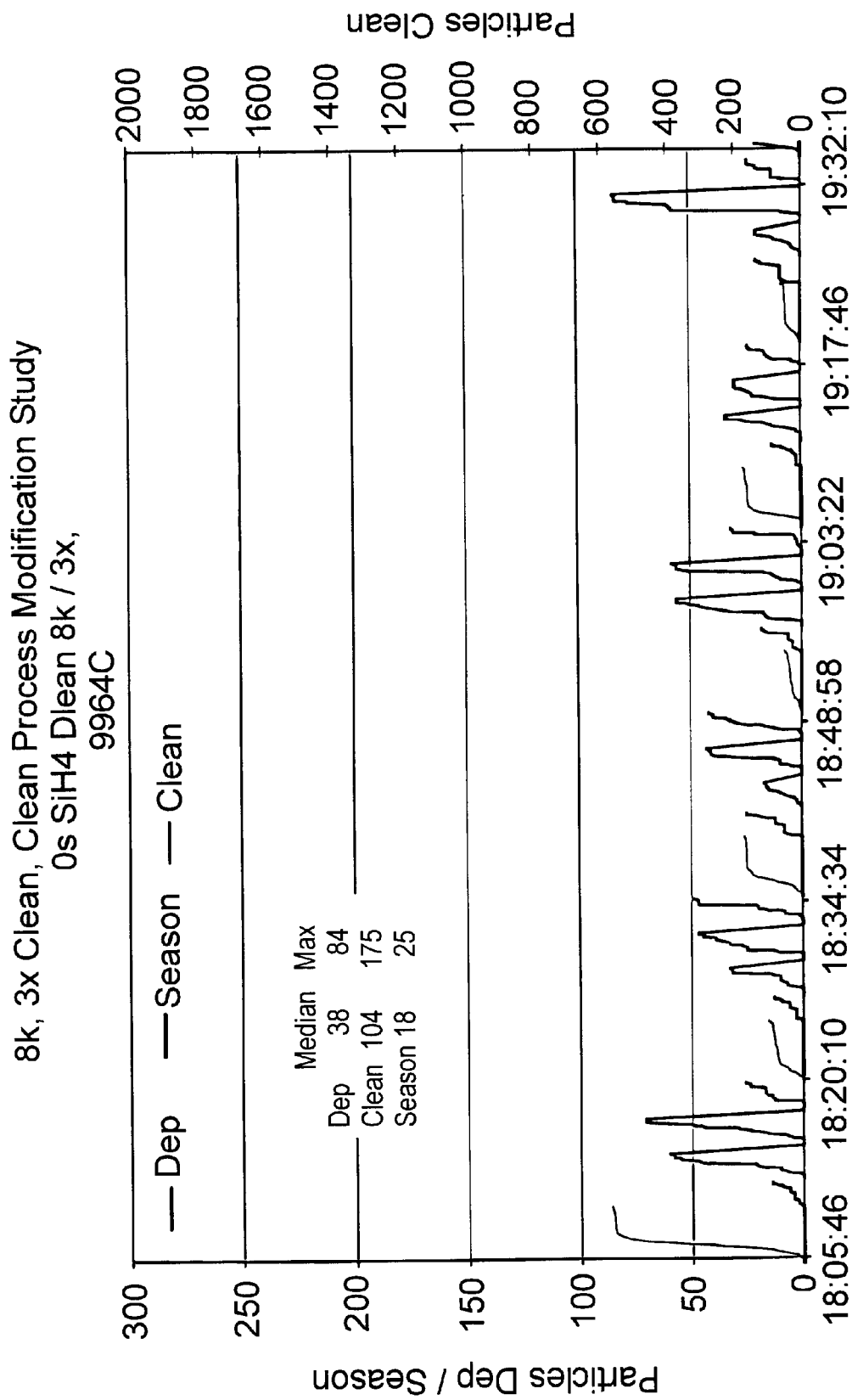
Figure 5D:
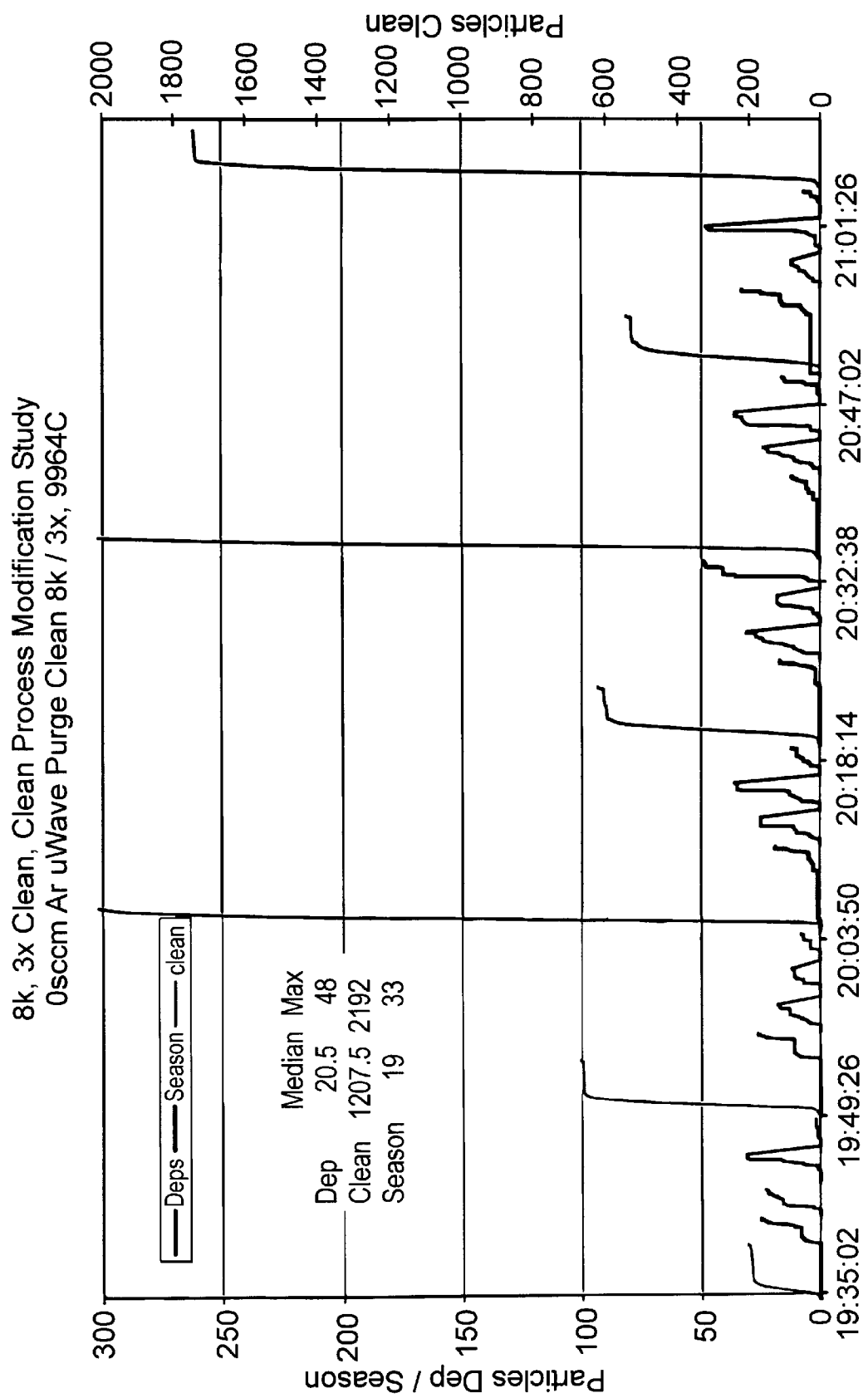
Figure 5E:
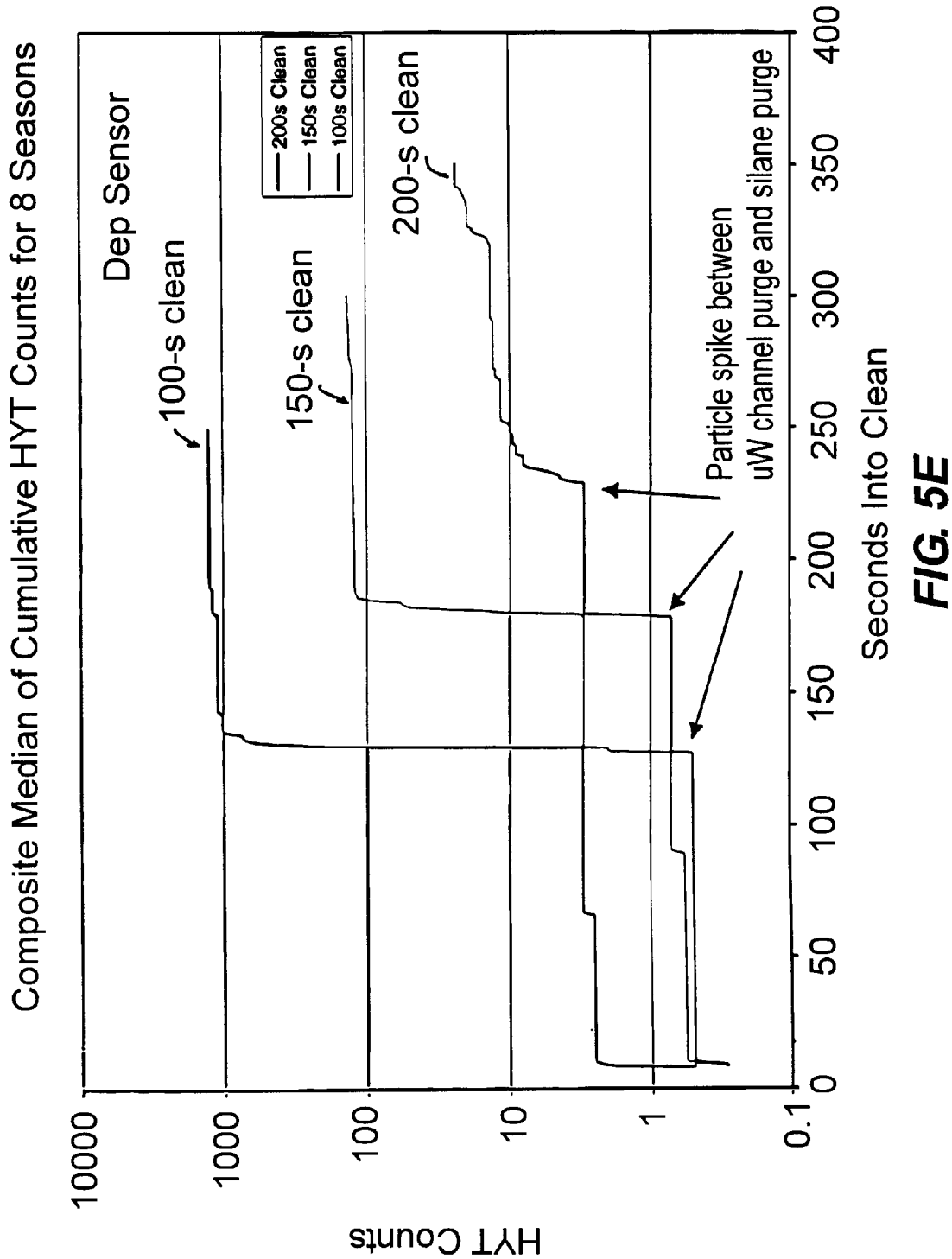
FIG. 5E shows a composite median of cumulative in situ particle counts for a recipe with different clean times.
Figure 5F:
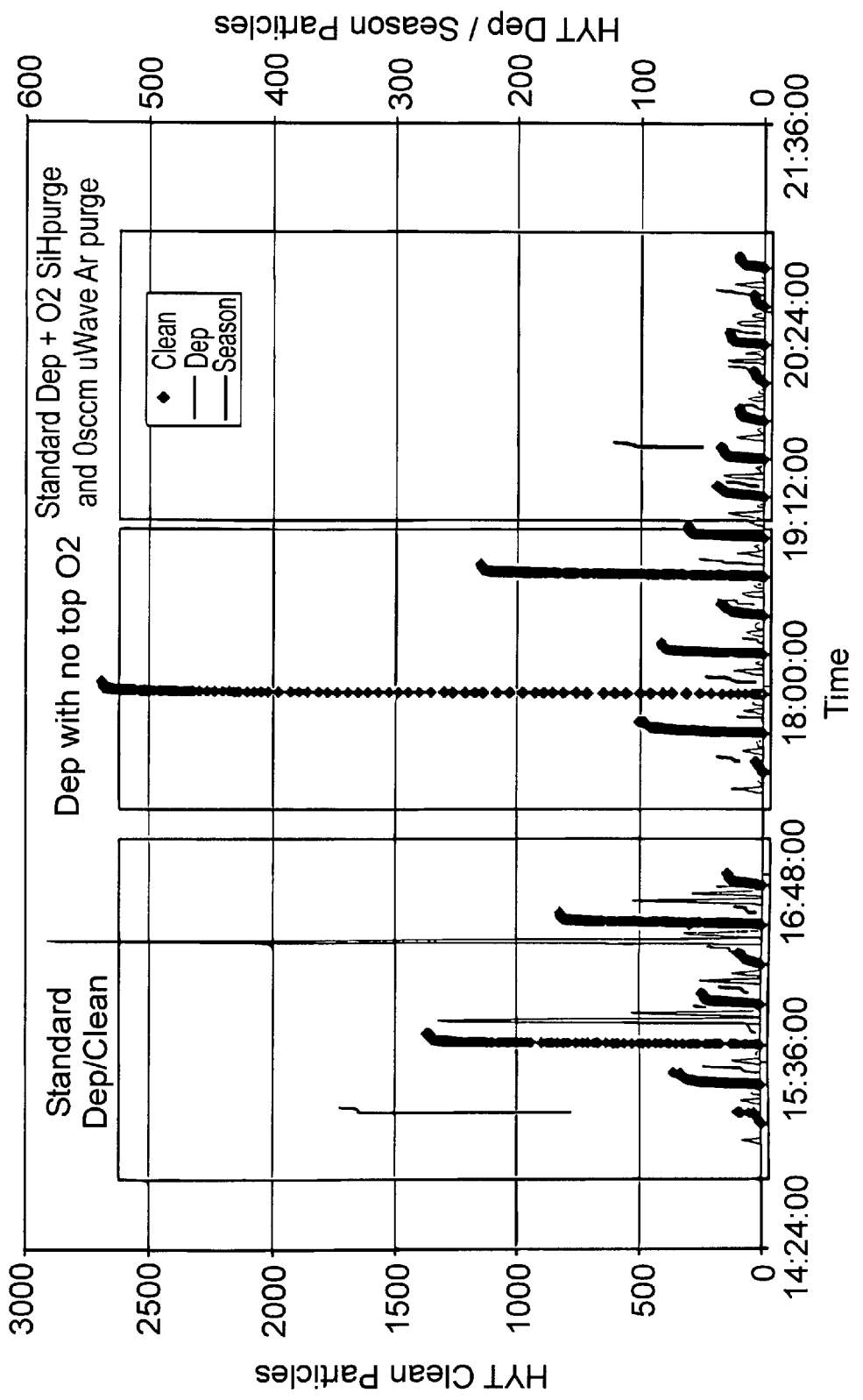
FIG. 5F compares the time dependence of in situ particle counts for different recipe variations.

The relative effect can be seen in FIG. 5F, in which in situ particle counts are provided for comparing the standard recipe with a recipe in which no top $O_2$ is provided in the

TABLE I

| Recipe Steps | Clean | Deposition | $SiH_4$ Purge | μW Ar Purge | Season |
|---|---|---|---|---|---|
| Time (s) | 300 | | 10 | 7 | 10 |
| Source RF (W) | 0 + 0 | 3000 + 1200 | 0 + 0 | 0 + 0 | 3100 + 1300 |
| Bias RF (W) | 0 | 2400 | 0 | 0 | 0 |
| Clean Power (W) | 5500 | 0 | 0 | 0 | 0 |
| Gas Flows (sccm) | | | | | |
| Ar | | 60 + 5 | | 200 + 40 | 95 + 15 |
| $NF_3$ | 1500 | | | | |
| $SiH_4$ | | 40 + 3.5 | 180 + 18 | | 85 |
| $O_2$ | | 116 | | | 130 |

FIG. 5A shows the results for the standard recipe over time, with the left-hand scale denoting in situ particle counts for the deposition and season steps, and the right-hand scale denoting in situ particle counts for the clean steps. FIG. 5B shows the same results with a 30-s $SiH_4$ purge; FIG. 5C shows the same results with a 0-s $SiH_4$ clean; and FIG. 5D shows the same results with a 0 sccm Ar microwave purge. The 30-s $SiH_4$ purge has a higher particle baseline for deposition and clean, but fewer instances of very large deposition step and with a recipe in which the no-SiH-purge and no-microwave-Ar-purge features are combined. All three are shown on the same scale for comparison, with deposition and season particle counts provided on the right-hand scale and clean particle counts provided on the left-hand scale. The deposition particle counts are comparable for both alternative recipes, with the no-SiH-purge+no-microwave-Ar-purge recipes additionally showing much reduced particle levels in the clean steps.

Having fully described several embodiments of the present invention, other equivalent or alternative methods of practicing the present invention will be apparent to those skilled in the art. For example, the information provided by in situ particle detection can be used to identify other sources of particle contamination in recipes and to develop modifications and improvements to such recipes to reduce levels of particle contamination. Accordingly, while the present invention has been disclosed in connection with the embodiments described above, it should be understood that other embodiments may fall within the spirit and scope of the invention, as defined by the following claims.

What is claimed is:

1. A method for identifying a source of particle contamination in a recipe for processing a substrate with a substrate processing system, the method comprising:
   detecting the presence of in situ particles within the substrate processing system over a period of time that spans a plurality of distinct processing steps within the recipe, including detecting in situ particles against a bright field during a first processing step and detecting in situ particles against a dark field during a second processing step;
   determining a time dependence of in situ particle levels from the detected particles; and
   correlating the distinct processing steps with the time dependence to identify relative particle levels among the distinct processing steps.

2. The method recited in claim 1 further comprising modifying the recipe in response to identifying relative particle levels among the distinct processing steps.

3. The method recited in claim 1 wherein the substrate processing system is a high-density-plasma chemical-vapor-deposition system.

4. A method for evaluating a plurality of recipes for processing a substrate with a substrate processing system, the method comprising: for each such recipe,
   detecting the presence of in situ particles within the substrate processing system over a period of time that spans a plurality of distinct processing steps within that recipe;
   determining a time dependence of in situ particle levels from the detected particles for that recipe;
   correlating the distinct processing steps with the time dependence for that recipe; and
   comparing relative particle levels for corresponding processing steps among the plurality of recipes.

5. The method recited in claim 4 wherein the substrate processing system is a high-density-plasma chemical-vapor-deposition system.

6. The method recited in claim 4 wherein detecting the presence of in situ particles comprises detecting in situ particles against a bright field.

7. The method recited in claim 4 wherein detecting the presence of in situ particles comprises detecting in situ particles against a dark field.

8. The method recited in claim 4 wherein detecting the presence of in situ particles comprises detecting in situ particles against a bright field during a first processing step and detecting in situ particles against a dark field during a second processing step.

9. A computer-readable storage medium having a computer-readable program embodied therein for directing operation of a substrate processing system including a process chamber; a plasma generation system; a substrate holder; and a gas delivery system configured to introduce gases into the process chamber, the computer-readable program including instructions for operating the substrate processing system to deposit a silicate glass layer on a plurality of substrates in the processing chamber in accordance with the following:
   executing a cyclic process of seasoning the substrate processing chamber with a flow comprising $SiH_4$ and $O_2$, depositing the silicate glass layer by plasma deposition within the substrate processing chamber with a flow comprising $SiH_4$ and $O_2$, purging the substrate processing chamber, and cleaning the substrate processing chamber,
   wherein purging the substrate processing chamber does not include purging with $SiH_4$.

10. The computer-readable storage medium recited in claim 9 wherein the plasma deposition comprises flowing deposition gases into the substrate processing chamber from sources substantially to the side of each of the plurality of substrates.

11. A substrate processing system comprising:
   a housing defining a process chamber;
   a plasma generating system operatively coupled to the process chamber;
   a substrate holder configured to hold a substrate during substrate processing;
   a gas-delivery system configured to introduce gases into the process chamber, including sources for a silicon-containing gas, a fluorine-containing gas, an oxygen-containing gas, and a nitrogen-containing gas;
   a pressure-control system for maintaining a selected pressure within the process chamber;
   a controller for controlling the high-density plasma generating system, the gas-delivery system, and the pressure-control system; and
   a memory coupled to the controller, the memory comprising a computer-readable medium having a computer-readable program embodied therein for directing operation of the substrate processing system, the computer-readable program including instructions to execute a cyclic process of seasoning the substrate processing chamber with a flow comprising $SiH_4$ and $O_2$, depositing the silicate glass layer by plasma deposition within the substrate processing chamber with a flow comprising $SiH_4$ and $O_2$, purging the substrate processing chamber, and cleaning the substrate processing chamber, wherein purging the substrate processing chamber does not include purging with $SiH_4$.

12. The substrate processing system recited in claim 11 wherein the plasma deposition comprises flowing deposition gases into the substrate processing chamber from sources substantially to the side of each of the plurality of substrates.

13. A substrate processing system comprising:
   a housing defining a process chamber;
   a high-density plasma generating system operatively coupled to the process chamber;
   a substrate holder configured to hold a substrate during substrate processing;
   a gas-delivery system configured to introduce gases into the process chamber, including sources for a silicon-containing gas, a fluorine-containing gas, an oxygen-containing gas, and a nitrogen-containing gas;

a pressure-control system for maintaining a selected pressure within the process chamber;

a vacuum system for pumping gas from the housing, the vacuum system including:
  a throttle body connected with the process chamber and with a pump through a tube;
  a brightfield particle sensor positioned withing the throttle body to detect particles exposed to light from plasma within the process chamber during operation of the substrate processing system; and
  a darkfield particle sensor positioned along the tube to detect particles isolated from light during operation of the substrate processing system; and a controller for controlling the high-density plasma generating system, the gas-delivery system, the pressure-control system, and the vacuum system.

* * * * *